(12) United States Patent
Choi

(10) Patent No.: US 12,075,685 B2
(45) Date of Patent: *Aug. 27, 2024

(54) DISPLAY DEVICE AND MANUFACTURING METHOD THEREOF

(71) Applicant: Samsung Display Co., Ltd., Yongin-si (KR)

(72) Inventor: Jin Baek Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 847 days.

This patent is subject to a terminal disclaimer.

(21) Appl. No.: 17/141,326

(22) Filed: Jan. 5, 2021

(65) Prior Publication Data
US 2021/0159285 A1 May 27, 2021

Related U.S. Application Data

(63) Continuation of application No. 16/027,861, filed on Jul. 5, 2018, now Pat. No. 10,903,283.

(30) Foreign Application Priority Data

Dec. 15, 2017 (KR) ........................ 10-2017-0172937

(51) Int. Cl.
*H01L 27/32* (2006.01)
*H10K 50/824* (2023.01)
(Continued)

(52) U.S. Cl.
CPC ........... *H10K 59/88* (2023.02); *H10K 50/824* (2023.02); *H10K 50/844* (2023.02);
(Continued)

(58) Field of Classification Search
CPC .... H10K 59/88; H10K 50/824; H10K 50/844; H10K 59/122; H10K 59/1315;
(Continued)

(56) References Cited

U.S. PATENT DOCUMENTS 7,173,368 B2   2/2007   Koo et al.
7,791,267 B2   9/2010   Baek et al.
(Continued)

FOREIGN PATENT DOCUMENTS

EP   3 091 575   11/2016
EP   3 113 229   1/2017
(Continued)

OTHER PUBLICATIONS

Extended European Search Report for European Application or Patent No. 18196458.6 dated Apr. 12, 2019.

*Primary Examiner* — Jack S Chen
(74) *Attorney, Agent, or Firm* — KILE PARK REED & HOUTTEMAN PLLC

(57) ABSTRACT

A display device includes a substrate with a display region and a non-display region. The display region includes first pixels, second pixels, and third pixels. Each of the first to third pixels have emission regions from which light is to be emitted, a light emitting element in the emission region, and a pixel circuit area to drive the light emitting element. A dummy pattern extends through a non-emission region of the substrate located in the display region between adjacent pixels. A thin film encapsulation layer covers the dummy pattern and each of the emission regions.

17 Claims, 23 Drawing Sheets

(51) Int. Cl.
*H10K 50/844* (2023.01)
*H10K 59/122* (2023.01)
*H10K 59/131* (2023.01)
*H10K 59/35* (2023.01)
*H10K 59/88* (2023.01)
*H10K 71/00* (2023.01)
*H10K 59/12* (2023.01)

(52) U.S. Cl.
CPC ....... *H10K 59/122* (2023.02); *H10K 59/1315* (2023.02); *H10K 59/352* (2023.02); *H10K 59/353* (2023.02); *H10K 71/00* (2023.02); *H10K 59/1201* (2023.02)

(58) Field of Classification Search
CPC .... H10K 59/352; H10K 59/353; H10K 71/00; H10K 59/1201; H10K 50/805; H10K 59/35; H10K 71/20; H10K 50/841
See application file for complete search history.

(56) References Cited

U.S. PATENT DOCUMENTS

| | | | |
|---|---|---|---|
| 9,054,341 B2 | 6/2015 | Kim et al. | |
| 9,091,913 B2 | 7/2015 | Katz et al. | |
| 9,679,952 B2 | 6/2017 | Miyazawa | |
| 10,079,274 B2 | 9/2018 | Choe et al. | |
| 10,903,283 B2 * | 1/2021 | Choi | ............... H10K 71/00 |
| 2006/0017375 A1 | 1/2006 | Noguchi et al. | |
| 2008/0067932 A1 | 3/2008 | Baek et al. | |
| 2008/0191603 A1 | 8/2008 | Kubota | |
| 2012/0217516 A1 | 8/2012 | Hatano et al. | |
| 2013/0001620 A1 | 1/2013 | Sugisawa et al. | |
| 2014/0084257 A1 | 3/2014 | Kim et al. | |
| 2014/0183479 A1 | 7/2014 | Park et al. | |
| 2015/0170563 A1 | 6/2015 | Bang | |
| 2016/0203765 A1 | 7/2016 | Lee | |
| 2016/0329391 A1 | 11/2016 | Ko et al. | |
| 2017/0194399 A1 | 7/2017 | Cho et al. | |

FOREIGN PATENT DOCUMENTS

| | | |
|---|---|---|
| JP | 2004-280054 | 10/2004 |
| JP | 2005-019151 | 1/2005 |
| JP | 2008-072078 | 3/2008 |
| JP | 2016-039029 | 3/2016 |
| JP | 2016-085796 | 5/2016 |
| JP | 2017-182912 | 10/2017 |
| KR | 10-2014-0082089 | 7/2014 |
| KR | 10-2017-0018235 | 2/2017 |

* cited by examiner

DISPLAY DEVICE AND MANUFACTURING METHOD THEREOF

CROSS-REFERENCE TO RELATED APPLICATION(S)

This is a continuation application of U.S. patent application Ser. No. 16/027,861 filed Jul. 5, 2018, which issued as U.S. Pat. No. 10.903.283 on Jan. 26. 2021 the disclosure of which is incorporated herein by reference in its entirety. U.S. patent application Ser. No. 16/027,861 claims priority benefit of Korean Patent Application 10-2017-0172937 filed Dec. 15, 2017, in the Korean Intellectual Property Office, the disclosure of which is incorporated herein by reference in its entirety for all purposes.

BACKGROUND

1. Field

One or more embodiments described herein relate to a display device and a method for manufacturing a display device.

2. Description of the Related Art

An organic light emitting display has a wide viewing angle, excellent contrast, fast response time, high brightness, and excellent driving voltage and response rate characteristics. The pixels of an organic light emitting display device include organic light emitting elements. In each organic light emitting element, electrons injected from one electrode and holes injected from the other electrode combine in an organic emitting layer to form excitons. Light is emitted when the excitons change state. The light maybe red, green, blue, white, or another color. Such a device may be used to realize a multicolor display.

SUMMARY

In accordance with one or more embodiments, a display device includes a substrate including a display region and a non-display region; first to third pixels in the display region, each of the first to third pixels having an emission region from which light is to be emitted; a light emitting element in the emission region of each of the first to third pixels; a pixel circuit area, in each of the first to third pixels, to drive the light emitting element; a dummy pattern in a non-emission region except the emission region, the dummy pattern extending along the extending direction of one pixel among the first to third pixels; and a thin film encapsulation layer covering the dummy pattern and the light emitting element.

The dummy pattern may be between the other two pixels except the one pixel. The light emitting element in each of the first to third pixels may include a first electrode electrically connected to the pixel circuit area; an emitting layer on the first electrode with a pixel defining layer exposing a portion of the first electrode interposed therebetween; and a second electrode on the emitting layer. The dummy pattern may include an organic pattern on the pixel defining layer to correspond to the non-emission region; and a conductive pattern on the organic pattern. The organic pattern may be in a same layer as the emitting layer, and the conductive pattern may be in a same layer as the second electrode.

The light emitting element may include a common electrode over the second electrode, and the common electrode may be commonly provided throughout the first to third pixels. The display device may include an auxiliary electrode disposed on the pixel defining layer to correspond to the non-emission region, the auxiliary electrode being disposed to be space apart from the dummy pattern. The auxiliary electrode may electrically connect the second electrode and the common electrode.

The first pixel, the second pixel, and the third pixel may emit light of different colors. The first pixel may emit red light, the second pixel may emit green light, the third pixel may emit blue light, and the size of the second pixel may be smaller than a size of each of the first and third pixels.

The second pixels may be consecutively arranged along a first direction of the substrate and may be repeatedly disposed for every two rows in a second direction intersecting the first direction. Two first pixels that are to emit red light, with one second pixel therebetween, may extend along a diagonal direction of the first direction, and two third pixels that are to emit blue light, with the one second pixel therebetween, may extend along a diagonal direction of the second direction. One first pixel between the two first pixels and one third pixel between the two third pixels may be alternately disposed along the second direction to form one pixel column. The dummy pattern may extend along the direction in which the two third pixels extend in the non-emission region of the substrate. The first pixel, the second pixel, and the third pixel may have a rhombus shape.

The pixel circuit area may include at least one transistor on the substrate, the at least one transistor may be electrically connected to the first electrode, and the transistor may include a semiconductor layer on the substrate; a gate electrode on the semiconductor layer with a gate insulating layer therebetween; and a source electrode and a drain electrode, each of the source electrode and the drain electrode connected to the semiconductor layer.

In accordance with one or more other embodiments, a method for manufacturing a display device includes preparing a substrate; forming a first electrode on the substrate; forming a pixel defining layer over the first electrode, wherein the pixel defining layer distinguishes an emission region from a non-emission region and exposes the first electrode corresponding the emission region; forming a sacrificial layer and a photoresist layer on the pixel defining layer; forming a photoresist pattern having a first opening by patterning the photoresist layer, the first opening exposing the sacrificial layer over the exposed first electrode and the sacrificial layer on the pixel defining layer; forming a sacrificial pattern having a second opening by etching the sacrificial layer exposed by the first opening using the photoresist pattern as a mask, the second opening exposing each of the first electrode in the emission region and the pixel defining layer in the non-emission region; forming an emitting layer on the first electrode in the emission region, which is exposed by the second opening; forming an organic pattern on the pixel defining layer in the non-emission region, which is exposed by the second opening; forming a second electrode on the emitting layer; forming a conductive pattern on the organic pattern; exposing the second electrode and the conductive pattern by removing the sacrificial pattern and the photoresist pattern; and forming a common electrode over the exposed second electrode and the expose conductive pattern.

The first opening of the photoresist pattern in the non-emission region and the second opening of the sacrificial pattern in the non-emission region may form a trench, the trench to receive an etchant used in etching the sacrificial layer. The trench may have a depth based on a sum of the thickness of the photoresist pattern and the thickness of the sacrificial pattern. The sacrificial layer may include a fluorine resin. The emitting layer and the organic pattern may include a same material and are in a same layer. The second electrode and the conductive pattern may include a same material and are in a same layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
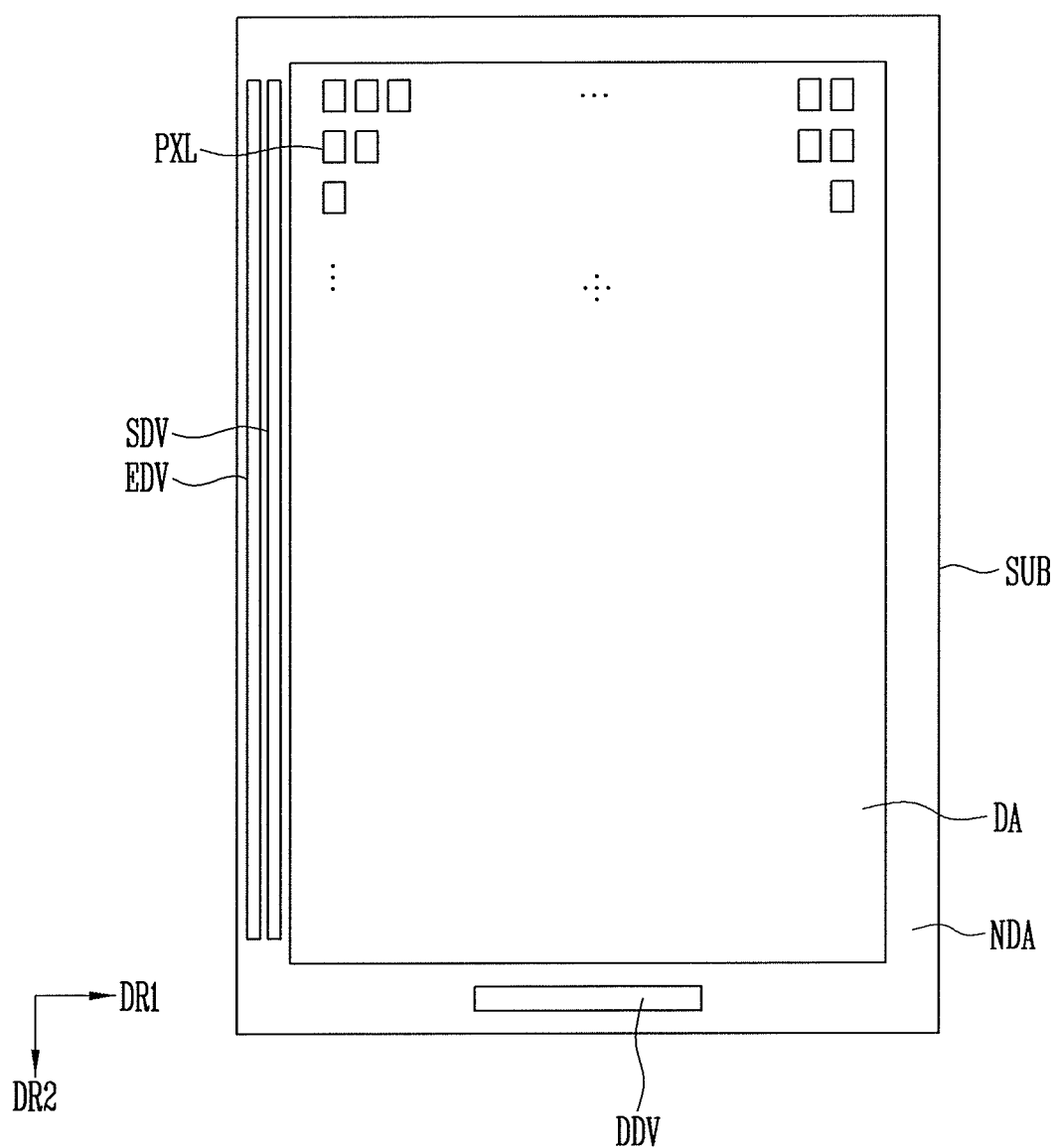
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

FIG. 1 illustrates an embodiment of a display device which may include a substrate SUB, pixels PXL on the substrate SUB, a driving unit (or driver) on the substrate SUB to drive the pixels PXL, and a line unit connecting the pixels PXL and the driving unit.

The substrate SUB may include a display region DA and a non-display region NDA. The display region DA includes the pixels PXL for displaying an image. The non-display region NDA includes the driving unit for driving the pixels PXL and lines that connect the pixels PXL and the driving unit. The non-display region NDA may, for example, correspond to a bezel in the final display device.

The display region DA may have various shapes. For example, the display region DA may, for example, have the shape of a closed polygon including linear sides, a circle, an ellipse, etc., including curved sides, and a semicircle, a semi-ellipse, etc., including linear and curved sides. When the display region DA includes a plurality of regions, each region may also have various shapes. Examples include a closed polygon including linear sides, a circle, an ellipse, etc., including curved sides, and a semicircle, a semi-ellipse, etc., including linear and curved sides. The areas of the plurality of regions may be the same or different from one another. In an embodiment, a case where the display region DA is provided as one region having a quadrangular shape including linear sides is described as an example.

The non-display area NDA may be at at least one side of the display area DA. In an embodiment, the non-display area NDA may surround the circumference of the display region DA. In an embodiment, the non-display region NDA may include at least one lateral part extending in the width direction thereof and at least one longitudinal part extending the length direction thereof. In one embodiment, a pair of longitudinal parts of the non-display region NDA may be provided and spaced apart from each other along the width direction of the display region DA.

The pixels PXL may be in the display region DA on the substrate SUB. Each of the pixels PXL is a minimum unit for emitting light for displaying an image and may be provided in plurality. In some embodiments, the pixels PXL may be considered sub-pixels. Each of the pixels PXL may include a light emitting element that emits white light and/or colored light. For example, each pixel PXL may emit red, green, blue, cyan, magenta, yellow, white, or another color of light.

A plurality of pixels PXL may be arranged in a matrix form along rows extending in a first direction DR1 and columns extending in a second direction DR2 intersecting the first direction DR1. The pixels PXL may be arranged differently in other embodiments. For example, some pixels PXL may be arranged in the first direction DR1 which is a row direction, but other pixels PXL may be arranged in a direction different from the first direction, e.g., a direction angularly oblique to the first direction DR1 as a row direction.

In one embodiment, the pixels PXL may be arranged such that a direction inclined to the first direction DR1 and the second direction DR2 is a column direction and a direction intersecting the column direction is a row direction. The column direction may also be inclined to the first direction DR1 and the second direction DR2.

The driving unit provides one or more signals to each pixel PXL through the line unit. Accordingly, driving of the pixel PXL may be controlled. The driving unit may include, for example, one or more of a scan driver SDV for providing a scan signal to the pixels PXL through scan lines, an emission driver EDV for providing an emission control signal to the pixels PXL through emission control lines, a data driver DDV for providing data signals to the pixels PXL through data lines, and a timing controller. The timing controller may control the scan driver SDV, the emission driver EDV, and/or the data driver DDV.

The scan driver SDV may be at the longitudinal part in the non-display region NDA. When a pair of longitudinal parts of the non-display region NDA is provided and spaced apart from each other along the width direction of the display region DA, the scan driver SDV may be at at least one of the longitudinal parts in the non-display region NDA. The scan driver SDV may extend long along the length direction of the non-display region NDA.

Like the scan driver SDV, the emission driver EDV may be at the longitudinal part in the non-display region NDA. The emission driver EDV may be at at least one of the longitudinal parts in the non-display region NDA. The emission driver EDV may extend long along the length direction of the non-display region NDA.

The data driver DDV may be in the non-display region NDA. For example, the data driver DDV may be at the lateral part of the non-display region NDA. The data driver DDV may extend long along the width direction of the non-display region NDA. The positions of the scan driver SDV, the emission driver EDV, and/or the data driver DDV may be different in other embodiments.

The timing controller may be connected to the scan driver SDV, the emission driver EDV, and the data driver DDV through corresponding lines. The position of the timing controller may differ among embodiments. For example, the timing controller may be mounted on a printed circuit board that is to be connected to the scan driver SDV, the emission driver EDV, and the data driver DDV through a flexible printed circuit board. The printed circuit board may be at various positions, e.g., at one side of the substrate SUB, on a back surface of the substrate SUB, or at another position.

Figure 2:
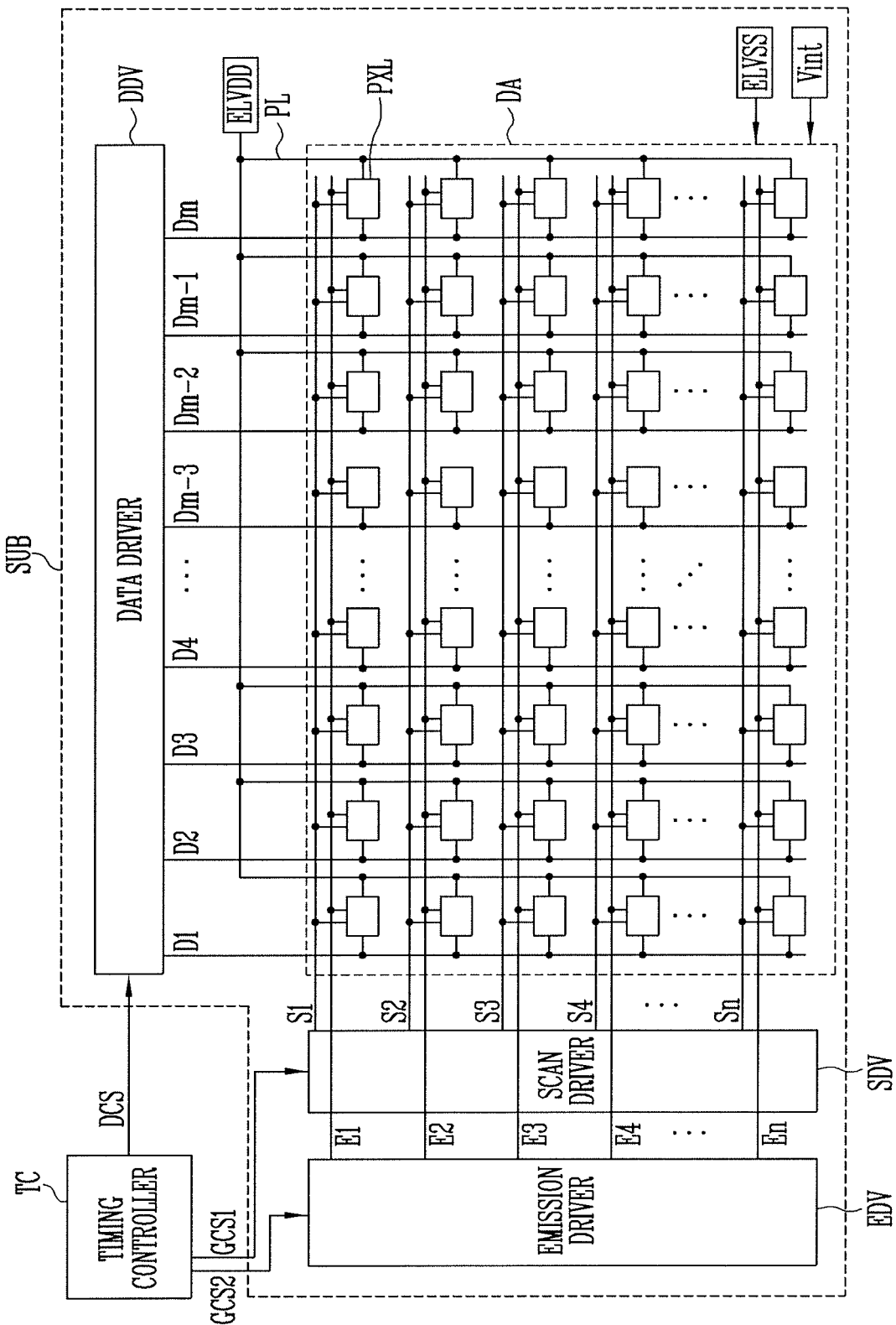
FIG. 2 illustrates an embodiment of pixels and a driving unit of the display device.

FIG. 2 illustrates a more detailed embodiment of the pixels and driving unit of the display device of FIG. 1. Referring to FIGS. 1 and 2, the display device according to this embodiment may include pixels PXL, a driving unit, and a line unit.

The driving unit may include a scan driver SDV, an emission driver EDV, a data driver DDV, and a timing controller TC. In FIG. 2, positions of the scan driver SDV, the emission driver EDV, the data driver DDV, and the timing controller TC are set for convenience of description. When an actual display device is implemented, the scan driver SDV, the emission driver EDV, the data driver DDV, and the timing controller TC may be at other positions in the display device.

The line unit may include scan lines, data lines, emission control lines, a power line PL, and an initialization power line that are located in a display region DA in order to provide signals from the drive unit to corresponding pixels PXL. The scan lines may include a plurality of scan lines S1 to Sn, the emission control lines may include a plurality of emission control lines E1 to En, and the data lines may include a plurality of data lines D1 to Dm.

The pixels PXL may be in the display region DA. When a scan signal is supplied from a scan line corresponding to each pixel PXL, the pixel PXL may be supplied with a data signal from a corresponding data line. The data signal may control the amount of current flowing from a first power source ELVDD provided through the power line PL to a second power source ELVSS via a light emitting element.

The scan driver SDV may apply the scan signal to the scan lines S1 to Sn based on a first gate control signal GCS1 from the timing controller TC. For example, the scan driver SDV may sequentially supply the scan signal to the scan lines S1 to Sn. When the scan signal is sequentially supplied to the scan lines S1 to Sn, the pixels PXL may be sequentially selected in units of horizontal lines.

The emission driver EDV may apply the emission control signal to the emission control lines E1 to En based on a second gate control signal GCS2 from the timing controller TC. For example, the emission driver EDV may sequentially supply the emission control signal to the emission control lines E1 to En.

The emission control signal may be set to a width greater than that of the scan signal. For example, an emission control signal supplied to an ith (i is a natural number) emission control line Ei may be supplied to overlap with a scan signal supplied to an (i-1)th scan line Si-1 and a scan signal supplied to an ith scan line Si during a partial period. Additionally, the emission control signal may be set to a gate-off voltage (e.g., a high voltage) to turn off transistors in the pixels PXL. The scan signal may be set to a gate-on voltage (e.g., a low voltage) to turn on transistors in the pixels PXL.

The data driver DDV may supply the data signal to the data lines D1 to Dm based on a data control signal DCS. The data signal supplied to the data lines D1 to Dm may be supplied to pixels PXL selected by the scan signal.

The timing controller TC may supply the gate control signals GCS1 and GCS2 to the scan driver SDV and the emission driver EDV. The gate control signals GCS1 and GCS2 may be generated based on timing signals from an external source. Also, the timing controller TC may supply the data control signal DCS to the data driver DDV.

A start pulse and clock signals may be in each of the gate control signals GCS1 and GCS2. The start pulse controls the timing of a first scan signal or a first light emitting control signal. The clock signals are used to shift the start pulse. A source start pulse and clock signals may be in the data control signal DCS. The source start pulse controls the sampling start time of data. The color signals are used to control a sampling operation.

Figure 3:
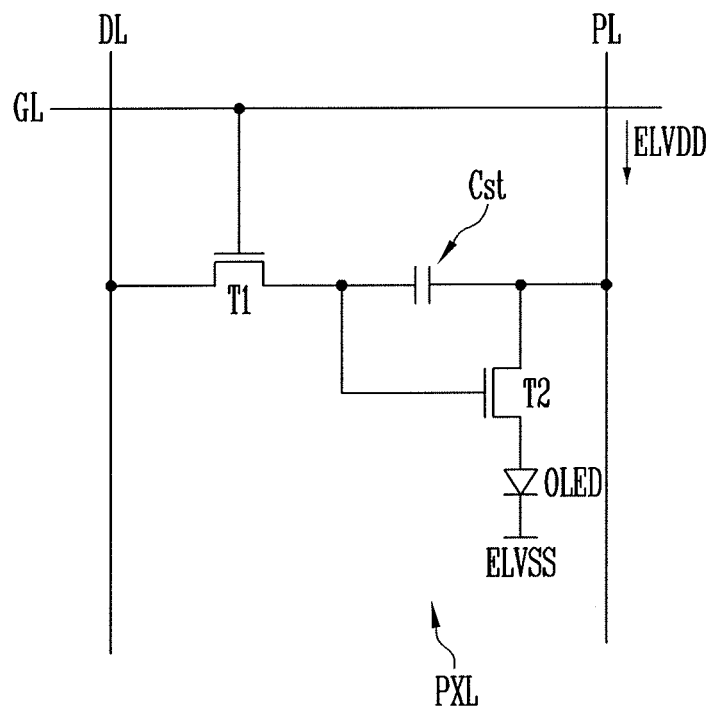
FIG. 3 illustrates an embodiment of a pixel.

FIG. 3 illustrates an equivalent circuit embodiment of a pixel, which, for example, may be representative of the pixels PXL of FIG. 1. For convenience of description, the pixel and lines connected to the pixel are mainly illustrated in FIG. 3.

Referring to FIGS. 1 and 3, the pixel PXL may include a transistor connected to lines, a light emitting element OLED connected to the transistor, and a capacitor Cst. The light emitting element OLED may be a top-emission type organic light emitting element or a bottom-emission type organic light emitting element. The organic light emitting element may be an organic light emitting diode.

The pixel PXL includes a pixel driving circuit for driving the light emitting element OLED, and, for example, may include a first transistor (or switching transistor) T1, a second transistor (or driving transistor) T2, and the capacitor Cst. A first power source ELVDD may be provided to the second transistor T2 through a power line PL. A second power source ELVSS may be provided to the light emitting element OLED. The second power source ELVSS may be set to a voltage lower than that of the first power source ELVDD.

The first transistor T1 outputs a data signal applied to a data line DL based on a scan signal applied to a gate line GL. The capacitor Cst charges a voltage corresponding to the data signal received through the first transistor T1. The second transistor T2 is connected to the light emitting element OLED and controls a driving current, flowing through the light emitting element OLED, based on the quantity of charges stored in the capacitor Cst.

The pixel PXL is illustrating has having two transistors T1 and T2 and one capacitor Cst. In other embodiments, the pixel PXL may include a different number of transistors and/or capacitors, e.g., one transistor and one capacitor, or three or more transistors and two or more capacitors. In one embodiment, the pixel PXL may include seven transistors, the light emitting element OLED, and the capacitor Cst.

Figure 4:
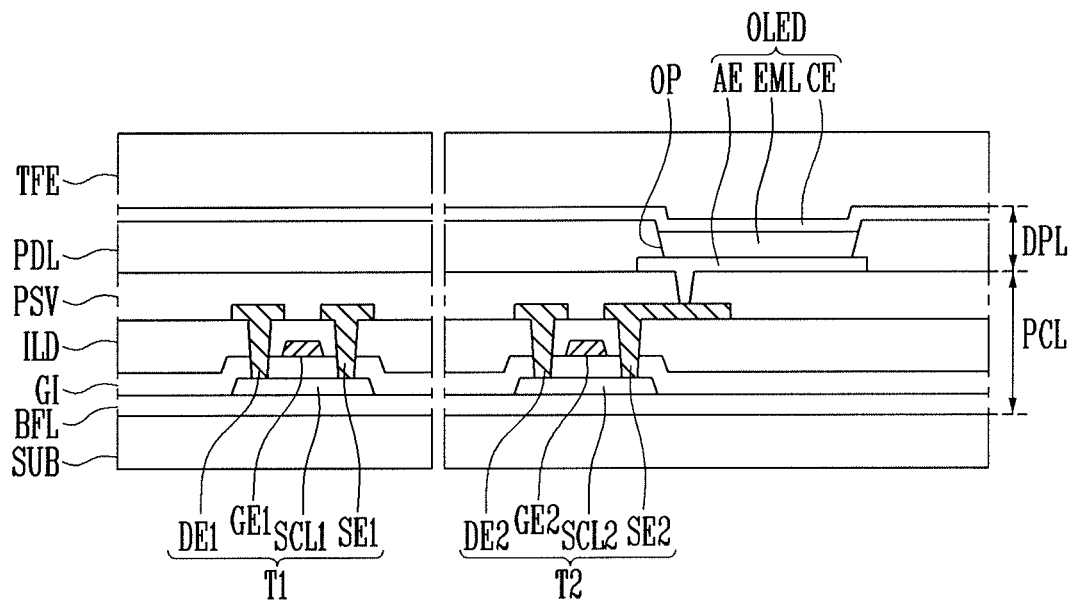
FIG. 4 illustrates a sectional embodiment of the display device.

FIG. 4 illustrates a cross-sectional view of a portion of the display device of FIG. 1 according to an embodiment.

Referring to FIGS. 1 and 4, the display device may include a substrate SUB, a pixel circuit unit PCL, a display element layer DPL, and a thin film encapsulation layer TFE. The substrate SUB may be made of flexible, bendable, or foldable material and may have a single- or multi-layered structure.

The pixel circuit unit PCL may include a buffer layer BFL on the substrate SUB and first and second transistors T1 and T2 on the buffer layer BFL. The buffer layer BFL may prevent an impurity from being diffused into the first and second transistors T1 and T2. The buffer layer BFL may be provided in a single layer, but may be provided in a multi-layer including at least two layers in another embodiment. When the buffer layer BFL is a multi-layer, the layers may be formed of the same or different materials. In one embodiment, the buffer layer BFL may be omitted according to the material and process conditions of the substrate SUB.

The first transistor T1 may be a switching transistor for switching the second transistor T2. The second transistor T2 may be a driving transistor electrically connected to a light emitting element OLED of the display element layer DPL, in order to drive the light emitting element OLED.

The first transistor T1 may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first and second semiconductor layers SCL1 and SCL2 may be on the buffer layer BFL. The first and second semiconductor layers SCL1 and SCL2 may include source regions and drain regions, which are in contact with the first and second source electrodes SE1 and SE2 and the first and second drain electrodes DE1 and DE2, respectively. A region between the source region and the drain region may be a channel region. Each of the first and second semiconductor layers SCL1 and SCL2 may be a semiconductor pattern made, for example, of poly-silicon, amorphous silicon, oxide semiconductor, etc. The channel region is a semiconductor pattern undoped with an impurity and, for example, may be an intrinsic semiconductor. The source region and the drain region are semiconductor patterns doped with the impurity. The impurity may be an n-type impurity, a p-type impurity, and/or may include other metals.

The first gate electrode GE1 may be on the first semiconductor layer SCL1, with a gate insulating layer GI therebetween. The second gate electrode GE2 may be on the second semiconductor layer SCL2, with the gate insulating layer GI therebetween.

The first source electrode SE1 and the first drain electrode DE1 may be in contact with the source region and the drain region of the first semiconductor layer SCL1 through contact holes passing through an interlayer insulating layer ILD and the gate insulating layer GI, respectively. The second source electrode SE2 and the second drain electrode DE2 may be in contact with the source region and the drain region of the second semiconductor layer SCL2 through contact holes passing through the interlayer insulating layer ILD and the gate insulating layer GI, respectively.

A protective layer PSV may be over the first and second transistor T1 and T2.

The display element layer DPL may include the light emitting element OLED on the protective layer PSV. The light emitting element OLED may include a first electrode AE, a second electrode CE, and an emitting layer EML between the two electrodes AE and CE. One of the first and second electrodes AE and CE may be an anode electrode. The other one of the first and second electrodes AE and CE may be a cathode electrode. For example, the first electrode AE may be an anode electrode and the second electrode CE may be a cathode electrode. When the light emitting element OLED is a top-emission type organic light emitting element, the first electrode AE may be a reflective electrode and the second electrode CE may be a transmissive electrode. A case where the light emitting element OLED is a top-emission type organic light emitting element and the first electrode AE is an anode electrode is described as an example.

The first electrode AE may be connected to the second source electrode SE2 of the second transistor T2 through a contact hole passing through the protective layer PSV. The first electrode AE may include a reflective layer for reflecting light and a transparent conductive layer on the top or bottom of the reflective layer. At least one of the transparent conductive layer and the reflective layer may be connected to the second source electrode SE2.

The display element layer DPL may include a pixel defining layer PDL having an opening that exposes a portion of the first electrode AE, e.g., a top surface of the first electrode AE.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be on the exposed surface of the first electrode AE. The emitting layer EML may include a low-molecular or high-molecular material. Examples of the low-molecular material include copper phthalocyanine (CuPc), N,N'-Di(naphthalene-1-yl)-N,N'-diphenyl-benzidine (NPB), tris-8-hydroxyquinoline aluminum (Alq3), and the like. The high-molecular material may include poly(3,4-ethylenedioxythiophene (PEDOT)-, poly (phenylene-vinylene) (PPV)-, poly(fluorine)-based materials.

The emitting layer EML may be a single layer or a multi-layer including various functions. When the emitting layer EML is a multi-layer, the emitting layer EML may have a structure in which a hole injection layer, a hole transport layer, an emission layer, an electron transport layer, and/or an electron injection layer are stacked in a single or complex structure. The emitting layer EML may have a different structure in another embodiment. At least a portion of the emitting layer EML may be integrally formed throughout a plurality of first electrodes AE or may be individually provided to correspond to respective ones of the plurality of first electrodes AE. The color of light generated in the emitting layer EML may be red, green, blue, white, magenta, cyan, yellow, or another color.

The second electrode CE may be on the emitting layer EML and may be a semi-transmissive reflective layer. For example, the second electrode CE may be a thin metal layer having a thickness through which light emitted through the emitting layer EML can be transmitted. The second electrode CE may transmit a portion of the light emitted from the emitting layer EML therethrough and may reflect the rest of the light emitted from the emitting layer EML.

The thin film encapsulation layer TFE may be over the light emitting element OLED. The thin film encapsulation layer TFE may be a single layer or a multi-layer. The thin film encapsulation layer TFE may include a plurality of insulating layers that cover the light emitting element OLED. In one embodiment, the thin film encapsulation layer TFE may include a plurality of inorganic layers and a plurality of organic layers. For example, the thin film encapsulation layer TFE may have a structure in which the inorganic layers and the organic layers are alternately stacked. Also, in some cases, the thin film encapsulation layer TFE may be an encapsulating substrate over the light emitting element OLED and joined together with the substrate SUB through a sealant.

Figure 5:
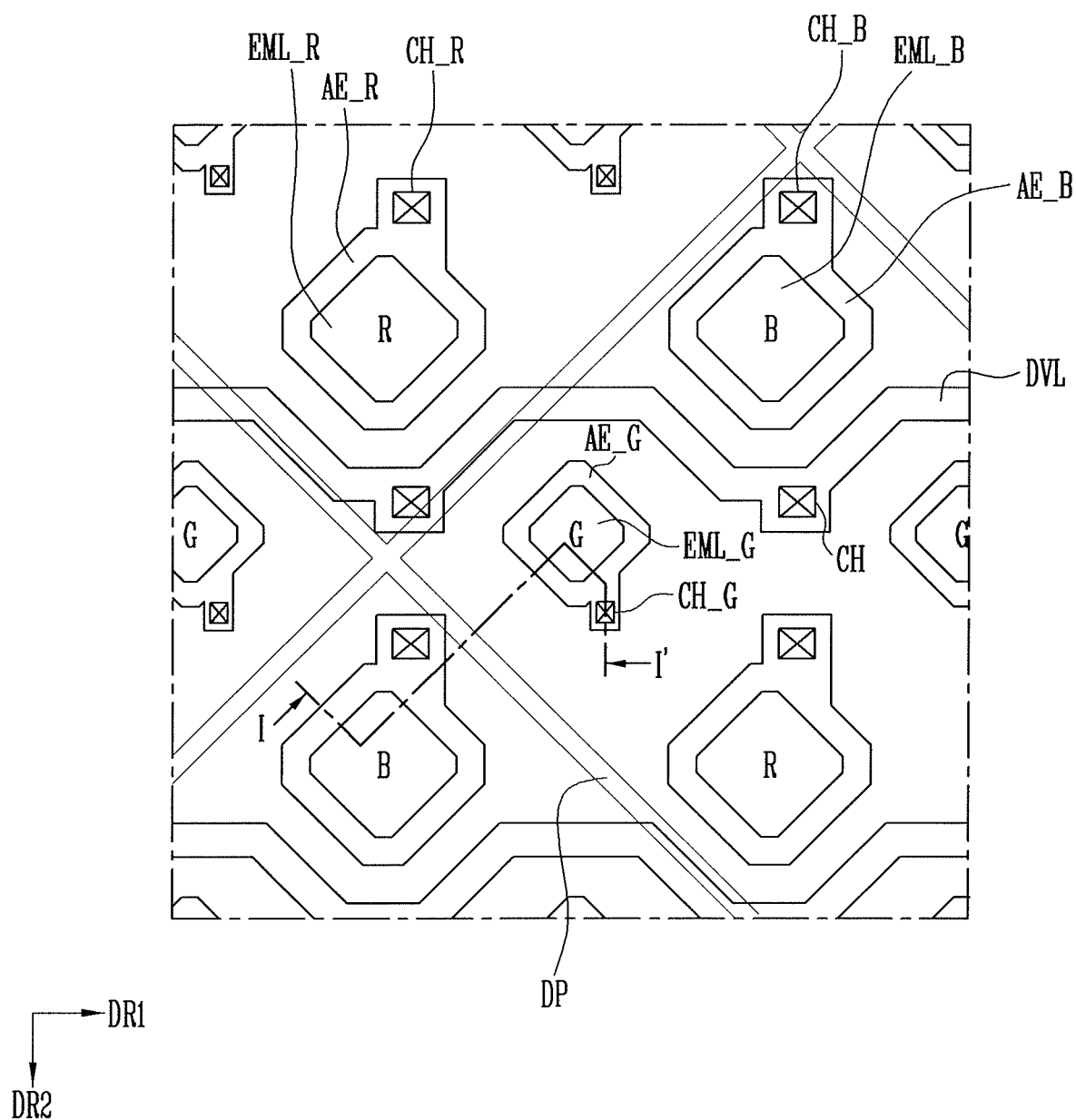
FIG. 5 illustrates an embodiment of pixels and a dummy pattern of the display device.
Figure 6:
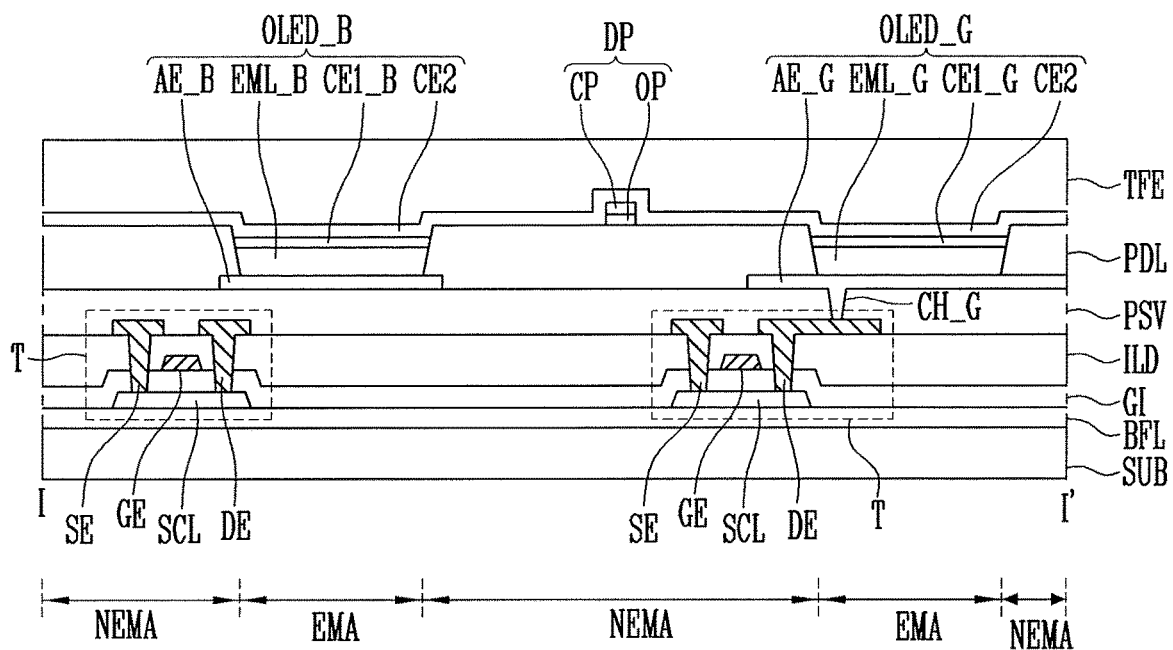
FIG. 6 illustrates a view taken along section line I-I' of FIG. 5 according to one embodiment.

FIG. 5 illustrates an embodiment of an arrangement relationship between pixels and a dummy pattern in the display device of FIG. 1. FIG. 6 illustrates a view taken along section line I-I' of FIG. 5 according to one embodiment.

Referring to FIGS. 1, 5, and 6, the display device may include a substrate SUB on which a first pixel, a second pixel, and a third pixel are provided. The substrate SUB may include a transparent insulating material to enable light to be transmitted therethrough. The substrate SUB may be a rigid substrate or a flexible substrate. The rigid substrate may include, for example, a glass substrate, a quartz substrate, a glass ceramic substrate, and a crystalline glass substrate. The flexible substrate may include a film substrate and a plastic substrate, which include a polymer organic material. For example, the flexible substrate may include one of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Also, the flexible substrate may include fiber glass reinforced plastic (FRP).

The material applied to the substrate SUB may have a resistance (or heat resistance) against high processing temperature in a manufacturing process of the display device. In an embodiment of the present disclosure, all or a portion of the substrate SUB may have flexibility.

In an embodiment, the first to third pixels may emit light of different colors. For example, the first pixel may be a red pixel R that emits red light, the second pixel may be a green pixel G that emits green light, and the third pixel may be a blue pixel B that emits blue light. In an embodiment, the second pixels G may be arranged along a first direction DR1 of the substrate SUB when viewed on a plane. Also, the second pixels G may be repeatedly disposed for every two rows along a second direction DR2 intersecting the first direction DR1 on the substrate SUB. The second pixels G may be arranged in the second direction DR2 to form a first pixel column.

The first pixels R and the third pixels B may be alternately disposed along the first direction DR1 of the substrate SUB when viewed on a plane. Also, the first pixels R and the third pixels B may be alternately disposed in the second direction DR2 to form a second pixel column. A plurality of first pixel columns and a plurality of second pixel columns may be provided and alternately disposed along the first direction DR1 on the substrate SUB.

In an embodiment, two first pixels R and two third pixels B may be located in four places in diagonal directions with respect to one second pixel G. The two first pixels R may be opposite to each other, with the one second pixel G therebetween. The two third pixels B may be opposite to each other, with the one second pixel G therebetween. Thus, in one embodiment, two first pixels R and two third pixels B may be on the substrate SUB surrounding the one second pixel G.

In an embodiment, the two first pixels R that are opposite to each other, with the one second pixel G therebetween, may extend along a diagonal direction of the first direction DR1 (e.g., first diagonal direction). The two third pixels B opposite to each other, with the one second pixel G therebetween, may extend along a diagonal direction of the second direction DR2 (e.g., second diagonal direction). In one embodiment, the second pixel G may have an area (or size) smaller than the first and third pixels R and B.

The first to third pixels R, G, and B may have a rhombus shape. In one embodiment, the first to third pixels R, G, and B may have a different shape, e.g., a circular shape, an elliptical shape, a polygonal shape, or another shape.

The first pixel R may include a first electrode AE_R for the first pixel, an emitting layer EML_R for the first pixel which emits the red light, and a second electrode for the first pixel on the emitting layer EML_R. The first electrode AE_R for the first pixel may be connected to a transistor for the first pixel, which is in the first pixel R, through a first pixel contact hole CH_R.

The second pixel G may include a first electrode AE_G for the second pixel, an emitting layer EML_G for the second pixel which emits the green light, and a second electrode CE1_G for the second pixel on the emitting layer EML_G. The first electrode AE_G for the second pixel may be connected to a transistor T for the second pixel, which is in the second pixel G, through a second pixel contact hole CH_G.

The third pixel B may include a first electrode AE_B for the third pixel, an emitting layer EML_B for the third pixel which emits the blue light, and a second electrode CE1_B for the third pixel on the emitting layer EML_B for the third pixel. The first electrode AE_B for the third pixel may be connected to a transistor T for the third pixel, which is in the third pixel B, through a third pixel contact hole CH_B.

A common electrode CE2 may be on the second electrode for the first pixel, the second electrode CE1_G for the second pixel, and the second electrode CE1_B for the third pixel. The common electrode CE2 may be commonly provided throughout the first to third pixels R, B, and B.

Therefore, the first pixel R may include a first light emitting element configured with the first electrode AE_R for the first pixel, the emitting layer EML_R for the first pixel, the second electrode for the first pixel, and the common electrode CE2. The second pixel G may include a second light emitting element OLED_G configured with the first electrode AE_G for the second pixel, the emitting layer EML_G for the second pixel, the second electrode CE1_G for the second pixel, and the common electrode CE2. The third pixel B may include a third light emitting element OLED_B configured with the first electrode AE_B for the third pixel, the emitting layer EML_B for the third pixel, the second electrode CE1_B for the third pixel, and the common electrode CE2.

The substrate SUB may include an emission regions EMA corresponding to each of the first light emitting element, the second light emitting element OLED_G, and the third light emitting element OLED_B, and a non-emission region NEMA except the emission region EMA.

The substrate SUB may include a driving voltage line DVL in the non-emission region NEMA to provide a driving voltage to the first to third pixels R, G, and B. The driving voltage may be a second power source (e.g., see ELVSS of FIG. 3). The driving voltage line DVL may be connected to the common electrode CE2 through a contact hole CH.

A dummy pattern DP may be in the non-emission region NEMA of the substrate SUB. The dummy pattern DP may extend along the extending direction of the two third pixels B, with the one second pixel G therebetween. For example, the dummy pattern DP may extend along the second diagonal direction in the non-emission region NEMA of the substrate SUB. The dummy pattern DP may extend along the first diagonal direction in the non-emission region NEMA of the substrate SUB. When viewed on a plane, the dummy pattern DP may partially overlap with the third pixel B. At this time, the dummy pattern DP may be between the other pixels except the third pixel B partially overlapping therewith, e.g., the first pixel R and the second pixel G.

In an embodiment, the dummy pattern DP may include an organic pattern OP on a pixel defining layer PDL and a conductive pattern CP on the organic pattern OP. The organic pattern OP may include the same material as the emitting layer EML_B for the third pixel, and may be in the same layer as the emitting layer EML_B for the third pixel. The conductive pattern CP may include the same material as the second electrode CE1_B for the third pixel, and may be in the same layer as the second electrode CE1_B for the third pixel.

Since the dummy pattern DP is partially disposed on the pixel defining layer PDL in the non-emission region NEMA of the substrate SUB, the dummy pattern DP may have no influence on lights respectively emitted from the first to third pixels R, G, and B.

A stacking order of the structure of the display device of FIG. 6 will now be described. A buffer layer BFL may be on the substrate SUB to prevent an impurity from being diffused into the transistor for the first pixel, the transistor T for the second pixel, and the transistor T for the third pixel. The buffer layer BFL may be a single layer or a multi-layer including at least two layers. When the buffer layer BFL is in the multi-layer, the layers may be formed of the same or different materials. In one embodiment, the buffer layer BFL may be omitted according to the material and process conditions of the substrate SUB.

A semiconductor layer SCL may be on the buffer layer BFL and may include a source region, a channel region, and a drain region. A gate insulating layer GI may be over the semiconductor layer SCL and may be an inorganic insulating layer including an inorganic material. The gate insulating layer GI may include, for example, at least one of silicon nitride, silicon oxide, and silicon oxynitride.

A gate electrode GE may be on the gate insulating layer GI and may define the channel region of the semiconductor layer SCL. An interlayer insulating layer ILD may be over the gate electrode GE. A source electrode SE and a drain electrode DE may be on the interlayer insulating layer ILD. The source electrode SE may be connected to the source region of the semiconductor layer SCL through a through-hole passing through the interlayer insulating layer ILD and the gate insulating layer GI. The drain electrode DE may be connected to the drain region of the semiconductor layer SCL through a through-hole passing through the interlayer insulating layer ILD and the gate insulating layer GI.

A protective layer PSV may be over the source electrode SE and the drain electrode DE. The protective layer PSV may include at least one of an inorganic insulating layer made of an inorganic material and an organic insulating layer made of an organic material. In one embodiment, the protective layer PSV may include an organic insulating layer on an inorganic insulating layer.

The first electrode AE_R for the first pixel, the first electrode AE_G for the second pixel, and the first electrode AE_B for the third pixel may be on the protective layer PSV. The first electrode AE_R for the first pixel may be connected to a drain electrode of the transistor for the first pixel through the first pixel contact hole CH_R passing through the protective layer PSV. The first electrode AE_G for the second pixel may be connected to a drain electrode DE of the transistor T for the second pixel through the second pixel contact hole CH_G passing through the protective layer PSV. The first electrode AE_B for the third pixel may be connected to a drain electrode DE of the transistor T for the third pixel through the third pixel contact hole CH_B passing through the protective layer PSV.

In an embodiment, the first light emitting element, the second light emitting element OLED_G, and the third light emitting element OLED_B may be a top-emission type organic light emitting element. Therefore, the first electrode AE_R for the first pixel, the first electrode AE_G for the second pixel, and the first electrode AE_B for the third pixel may be transmissive electrodes. Accordingly, each of the first electrode AE_R for the first pixel, the first electrode AE_G for the second pixel, and the first electrode AE_B for the third pixel may include a reflective layer for reflecting light and a transparent conductive layer on the top or bottom of the reflective layer to reflect light.

The reflective layer may include a material capable of reflecting light. Examples include at least one of gold (Au), magnesium (Mg), aluminum (Al), silver (Ag), chromium (Cr), molybdenum (Mo), platinum (Pt), nickel (Ni), palladium (Pd), calcium (Ca), neodymium (Nd), iridium (Ir), lithium (Li), and any alloy thereof.

The transparent conductive layer may include a transparent conductive oxide. Examples include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be over the first electrode AE_R for the first pixel, the first electrode AE_G for the second pixel, and the first electrode AE_B for the third pixel. The pixel defining layer PDL may protrude from the substrate SUB along the circumferences of the first to third pixels R, G, and B. The pixel defining layer PDL may include openings that respectively expose a portion of the first electrode AE_R for the first pixel, a portion of the first electrode AE_G for the second pixel, and a portion of the first electrode AE_B for the third pixel. The pixel defining layer PDL may include, for example, an organic insulating layer.

The emitting layer EML_R may be on the exposed top surface of the first electrode AE_R for the first pixel. The emitting layer EML_G for the second pixel may be on the exposed top surface of the first electrode AE_B for the second pixel. The emitting layer EML_B may be on the exposed top surface of the first electrode AE_B for the third pixel. In addition, the organic pattern OP may be on the pixel defining layer PDL in the non-emission region NEMA.

Each of the emitting layer EML_R for the first pixel, the emitting layer EML_G for the second pixel, the emitting layer EML_B for the third pixel, and the organic pattern OP may have a multi-layered thin film structure including at least a light generation layer. For example, each of the emitting layer EML_R for the first pixel, the emitting layer EML_G for the second pixel, the emitting layer EML_B for the third pixel, and the organic pattern OP may include a hole injection layer, a hole transport layer, the light generation layer, a hole blocking layer, an electron transport layer, and/or an electron injection layer. The color of light generated from the light generation layer may be red, green, blue, white, magenta, cyan, yellow, or another color.

The hole injection layer, the hole transport layer, the hole blocking layer, the electron transport layer, and the electron injection layer may be common layers connected in adjacent emission regions.

The second electrode for the first pixel may be on the emitting layer EML_R for the first pixel. The second electrode CE1_G for the second pixel may be on the emitting layer EML_G for the second pixel. The second electrode CE1_B for the third pixel may be on the emitting layer EML_B for the third pixel. The conductive pattern CP may be on the organic pattern OP.

The common electrode CE2 may be over the second electrode for the first pixel, the second electrode CE1_G for the second pixel, the second electrode CE1_B for the third pixel, and the conductive pattern CP. A thin film encapsulation layer TFE may be provided to cover the common electrode CE2.

Figure 8A:
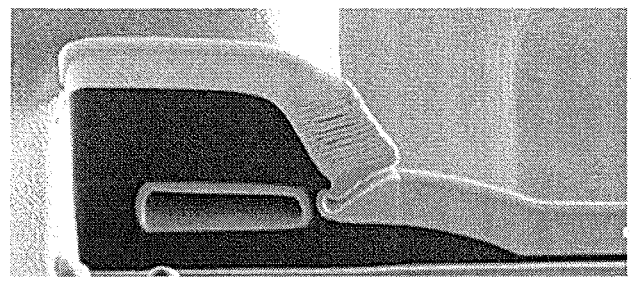
FIG. 8A illustrates an example of an image of a portion of a sacrificial pattern when a trench is not in a non-display region of a pixel.
Figure 8B:
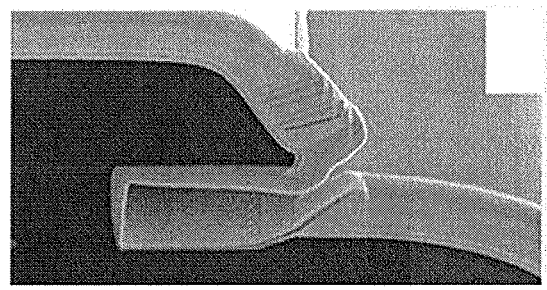
FIG. 8B illustrates an example of an image of a portion of the sacrificial pattern when a trench is in the non-display region of the pixel.
Figure 9A:
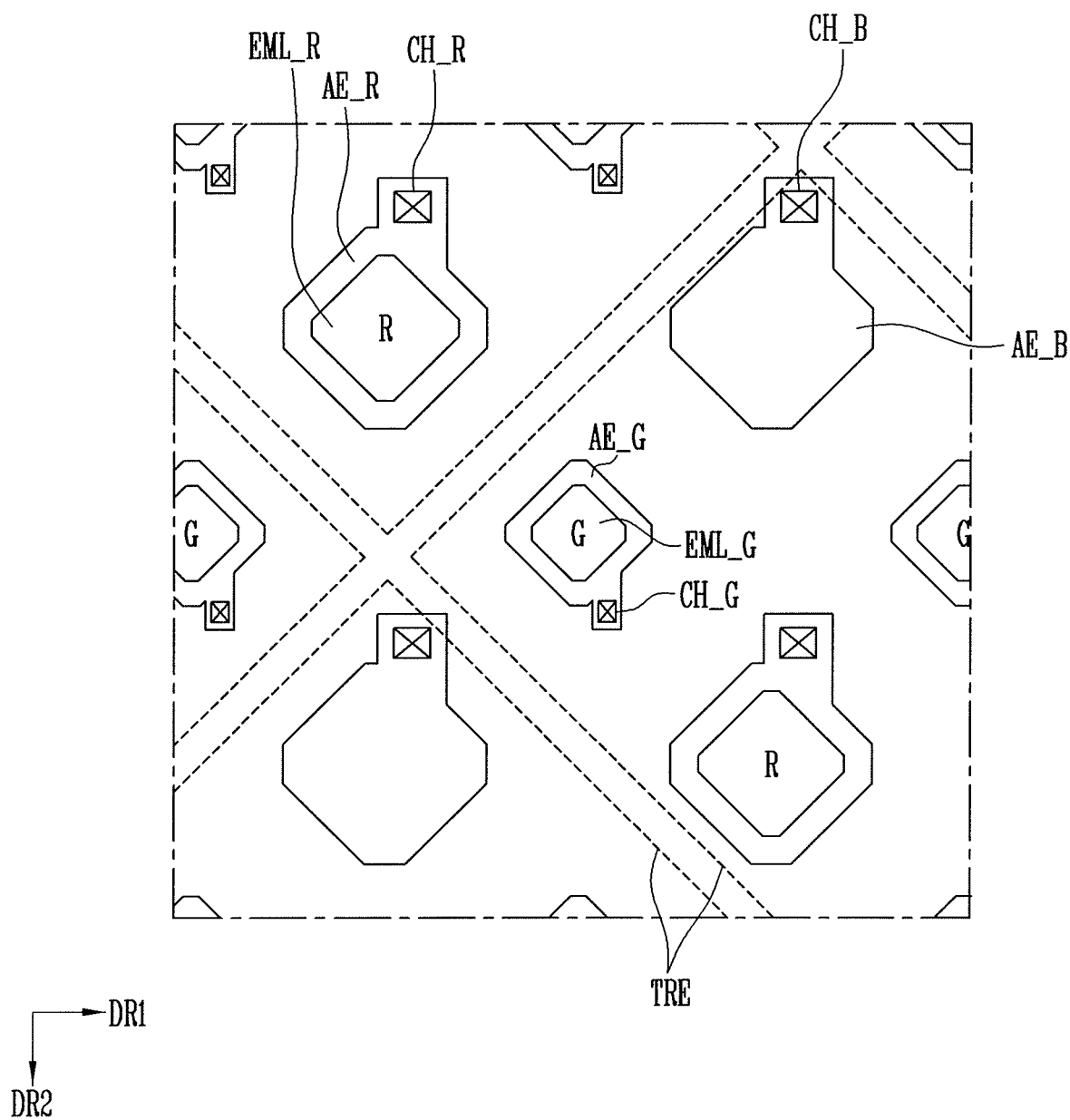
FIG. 9A illustrates an embodiment of a pixel in a manufacturing process of the display device corresponding to FIG. 7D.
Figure 9B:
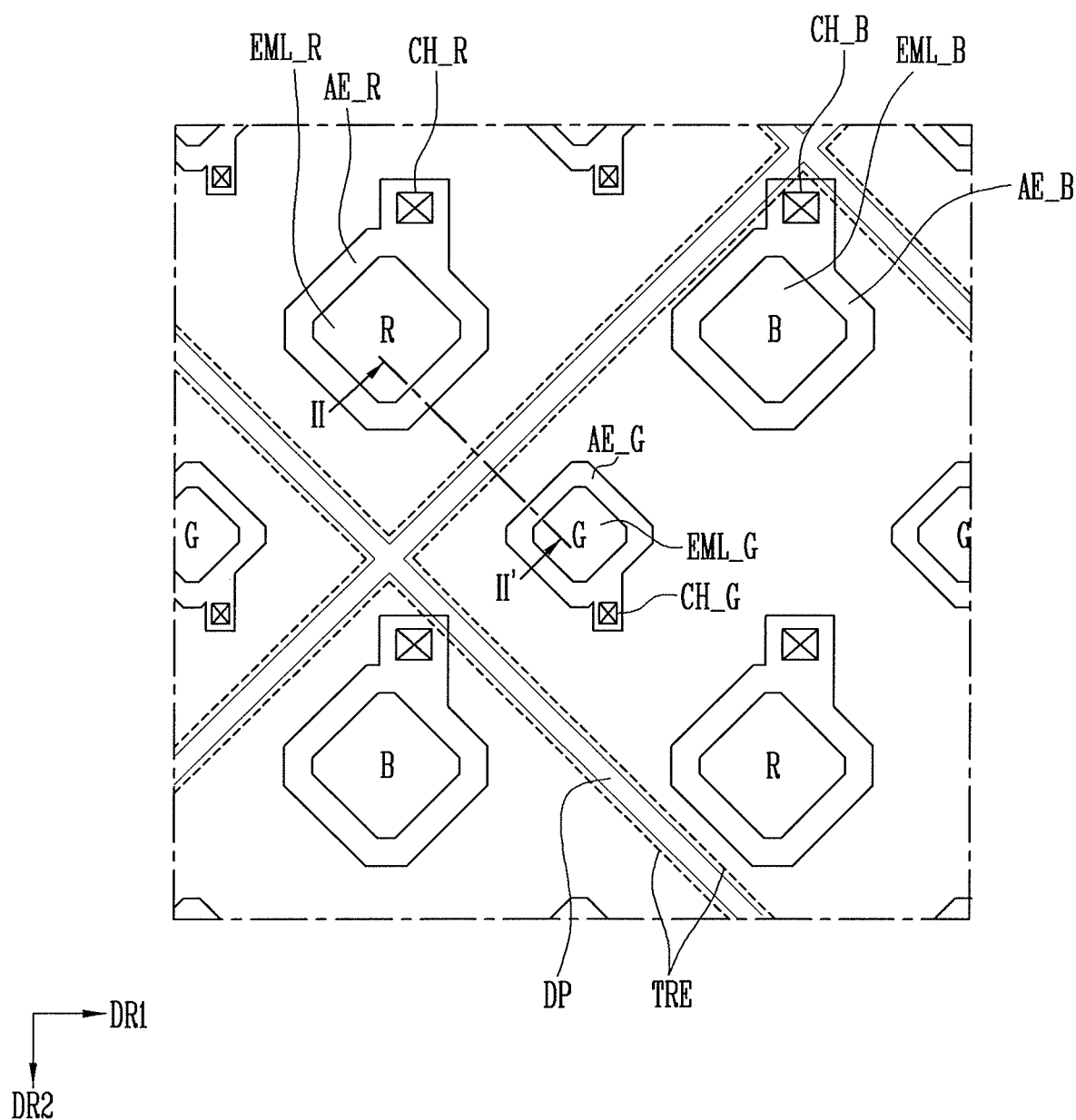
FIG. 9B illustrates an embodiment of the pixel in a manufacturing process corresponding to FIG. 7E.
Figure 9C:
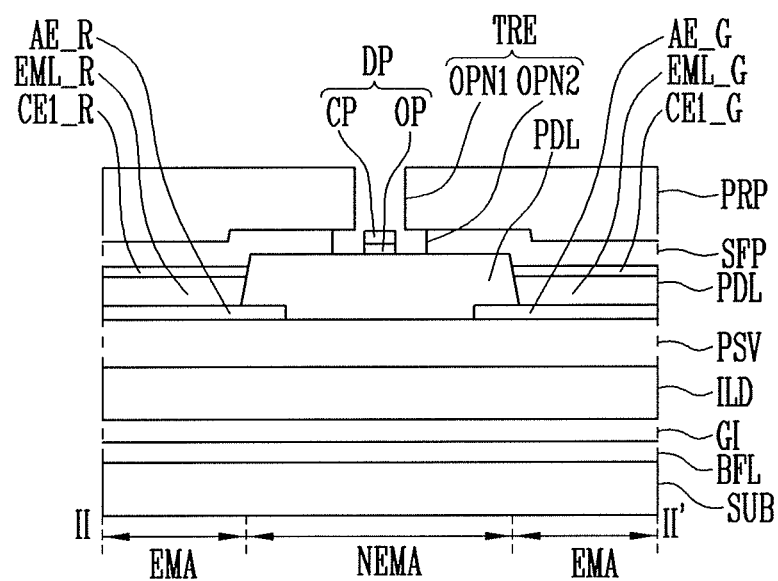
FIG. 9C illustrates a view taken along section line II-II' of FIG. 9B according to an embodiment.

FIGS. 7A to 7G are sectional views of various stages of a method for manufacturing the display device of FIGS. 5 and 6 according to one embodiment. FIG. 8A illustrates an example of an image of a portion of a sacrificial pattern when a trench is not in a non-display region of a pixel. FIG. 8B illustrates an example of an image of a portion of the sacrificial pattern when a trench is in the non-display are of the pixel. FIG. 9A illustrates an embodiment of a pixel corresponding to FIG. 7D. FIG. 9B illustrates an embodiment of a pixel corresponding to FIG. 7E. FIG. 9C illustrates an example of a view taken along section line II-II' of FIG. 9B.

In FIGS. 7A to 7G and 9A to 9C, processes for manufacturing a third light emitting device, a dummy pattern, and a thin film encapsulation layer on a substrate having transistors thereon are sequentially illustrated for convenience of description.

Referring to FIGS. 5, 6, 7A, and 9C, a pixel defining layer PDL is displayed on a substrate SUB to expose portions of a first electrode AE_R for a first pixel, a first electrode AE_G for a second pixel, and a first electrode AE_B for a third pixel. The substrate SUB may have transistors T thereon.

Subsequently, an emitting layer EML_R and a second electrode CE1_R for the first pixel may be disposed on the exposed first electrode AE_R of the first pixel. Therefore, an emission region EMA including a structure in which the first electrode AE_R for the first pixel, the emitting layer EML_R for the first pixel, and the second electrode CE1_R for the first pixel are stacked may be formed in a first pixel R on the substrate SUB.

In addition, an emitting layer EML_G for the second pixel and a second electrode CE1_G for the second pixel may be disposed on the exposed first electrode AE_G for the second pixel. Therefore, an emission region EMA including a structure in which the first electrode AE_G for the second pixel, the emitting layer EML_G for the second pixel, and the second electrode CE1_G for the second pixel are stacked may be formed in a second pixel G on the substrate SUB.

Figure 7A:
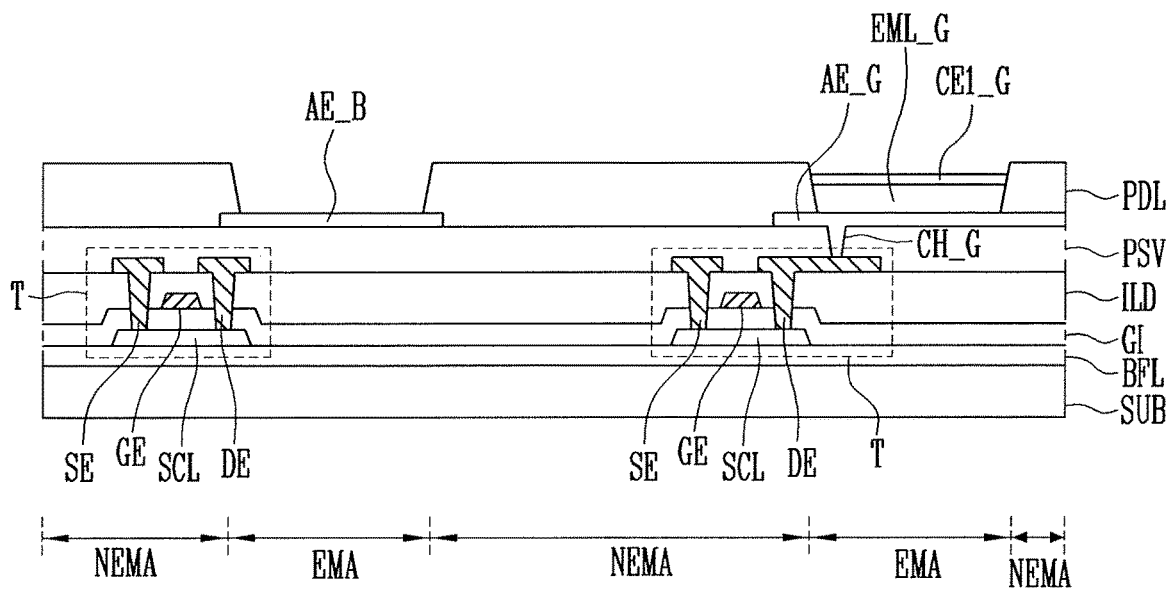
FIGS. 7A to 7G illustrate stages in a method for manufacturing a display device according to an embodiment.
Figure 7B:
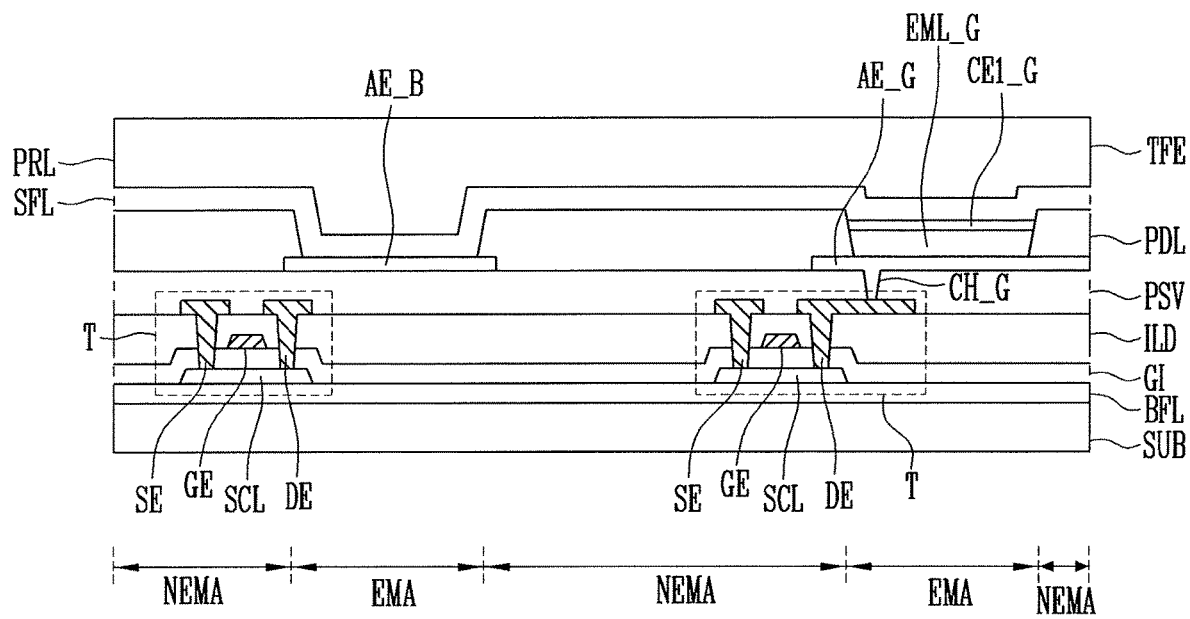

Referring to FIG. 7B, a sacrificial layer SFL and a photoresist layer PRL may be disposed on the substrate SUB including the emission region EMA of the first pixel R and the emission region EMA of the second pixel G. In an embodiment, the sacrificial layer SFL may include a fluorine-based material, e.g., a fluorine resin, etc. The fluorine-based material is photosensitive and may be exposed and developed by light. The fluorine-based material may be of a positive type (a portion exposed to light is removed during development) or a negative type (a portion not exposed to light is removed during development).

Figure 7C:
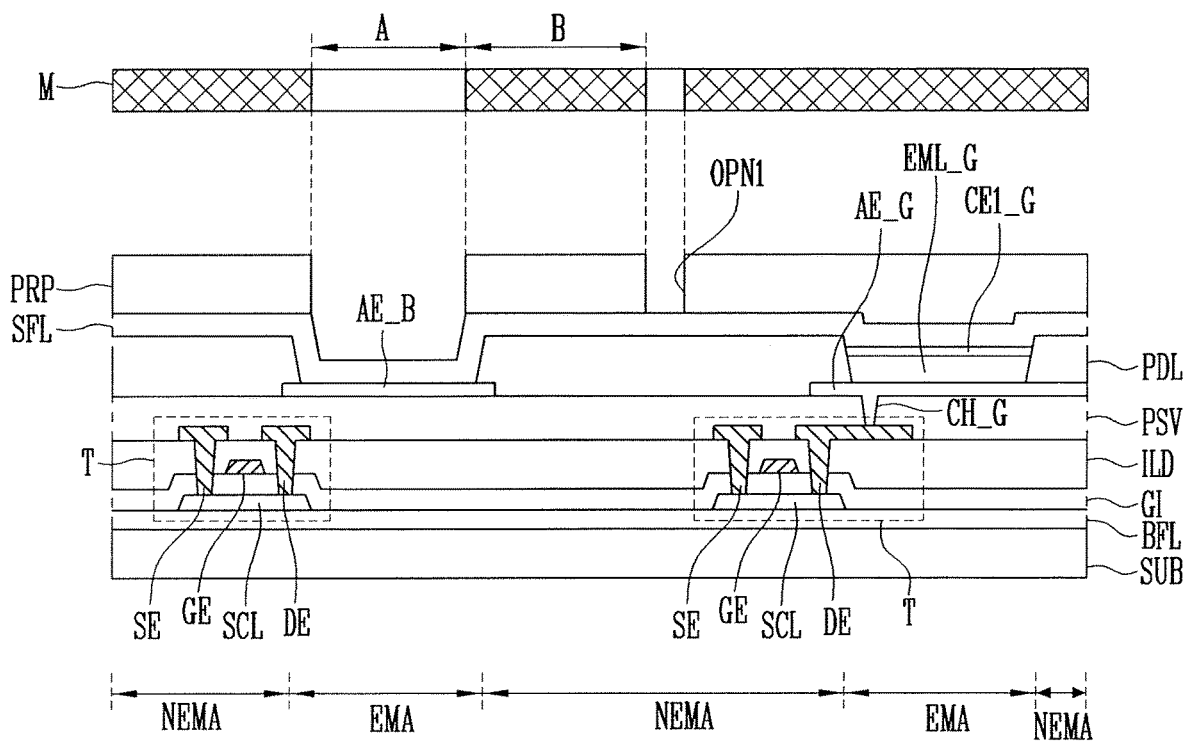

Referring to FIGS. 7C and 9C, a mask M is disposed above the substrate SUB on which the sacrificial layer SFL and the photoresist layer PRL are provided. The mask M may include a first part A and a second part B. The first part A of the mask M may be a region through which light is transmitted in a photomask process. The second part B of the mask M may be a region by which the light is blocked.

A photoresist pattern PRP including a first opening OPN1 that exposes a portion of the sacrificial layer SFL is formed using the mask M. The first opening OPN1 may correspond to an emission region EMA of a third pixel B. Also, the first opening OPN1 may correspond to a portion of a non-emission region NEMA except the emission region EMA. For example, the sacrificial layer SFL corresponding to the emission region EMA of the third pixel B may be exposed to the outside by the first opening OPN1. The sacrificial layer SFL corresponding to the portion of the non-emission region NEMA may be exposed to the outside by the first opening PON1. Therefore, the emission region EMA of the third pixel B and the portion of the non-emission region NMEA may be opened.

Figure 7D:
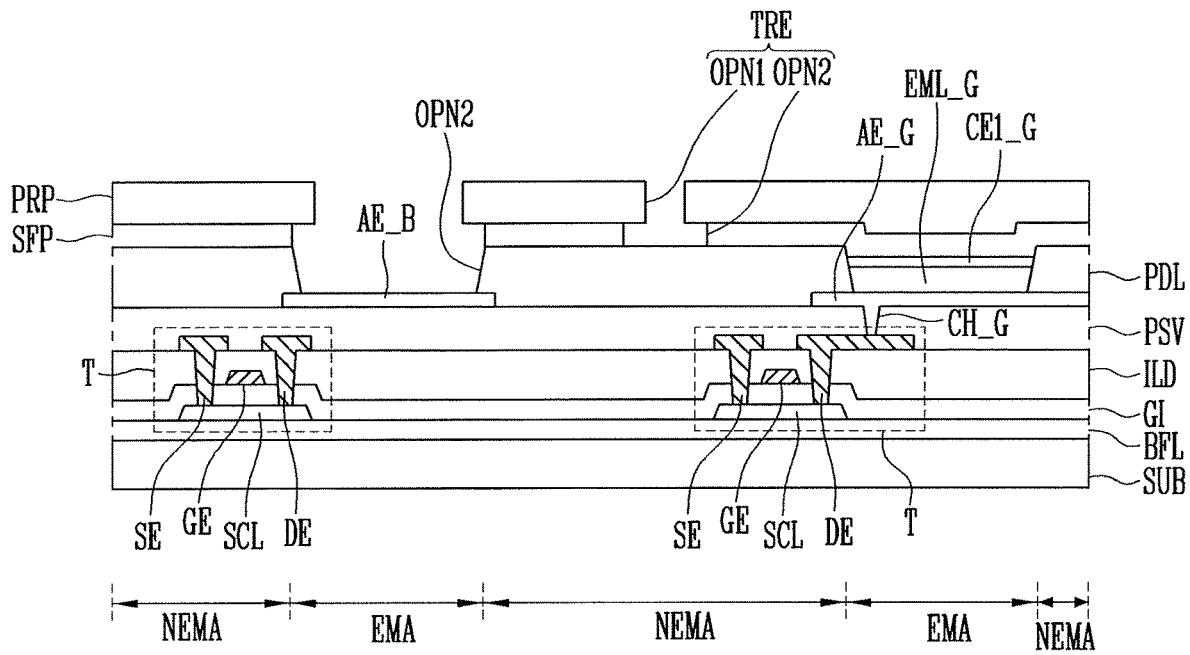

Referring to FIGS. 7D, 9A, and 9C, the sacrificial layer SFL exposed by the first opening OPN1 is etched using the photoresist pattern PRP as a mask. Therefore, a sacrificial pattern SFP including a second opening OPN2 is formed. At this time, the sacrificial layer SFL may be etched using an etchant made of a fluorine-based solvent.

The second opening OPN2 may correspond to the emission region EMA of the third pixel B to expose a first electrode AE_B for the third pixel to the outside. Also, the second opening OPN2 may correspond to the non-emission region NEMA to expose a portion of the pixel defining layer PDL to the outside.

In an embodiment, the second opening OPN2 and the first opening OPN1, which correspond to the non-emission region NEMA, may constitute a trench TRE. The trench TRE may allow the echant, obtained by melting the sacrificial layer SFL, not to remain in the third pixel B by inducing the etchant to be discharged outside the substrate SUB. The trench TRE may extend along the extending direction of the third pixels B that emit the same blue light in the non-emission region NEMA of the substrate SUB. For example, the trench TRE may extend along a second direction DR2, e.g., the direction in which the third pixels B disposed adjacent to each other along a diagonal direction of the column direction extend in the non-emission region NEMA of the substrate SUB. The trench TRE may have a depth corresponding, for example, to the sum of the thickness of the sacrificial pattern SFP and the thickness of the photoresist pattern PRP.

Referring to FIGS. 7E, 9A, 9B, and 9C, an emission layer EML_B for the third pixel is formed on the exposed first electrode AE_B for the third pixel. An organic pattern OP is formed on the pixel defining layer PDL exposed in the non-emission region NEMA. The emitting layer EML_B for the third pixel and the organic pattern OP may include the same material and be in the same layer.

Subsequently, a second electrode CE1_B for the third pixel is formed on the emitting layer EML_B for the third pixel. A conductive pattern CP is formed on the organic pattern OP. The second electrode CE1_B for the third pixel and the conductive pattern CP may include the same material and be in the same layer.

In an embodiment, the organic pattern OP and the conductive pattern CP are in the non-emission region NEMA and may constitute a dummy pattern DP. The dummy pattern DP may be in the trench TRE. The dummy pattern DP may extend along the extending direction of the trench TRE. Therefore, the dummy pattern DP may extend along the direction in which the third pixels B disposed adjacent to each other in a diagonal direction of the second direction DR2 extend in the non-emission region NEMA of the substrate SUB.

Figure 7E:
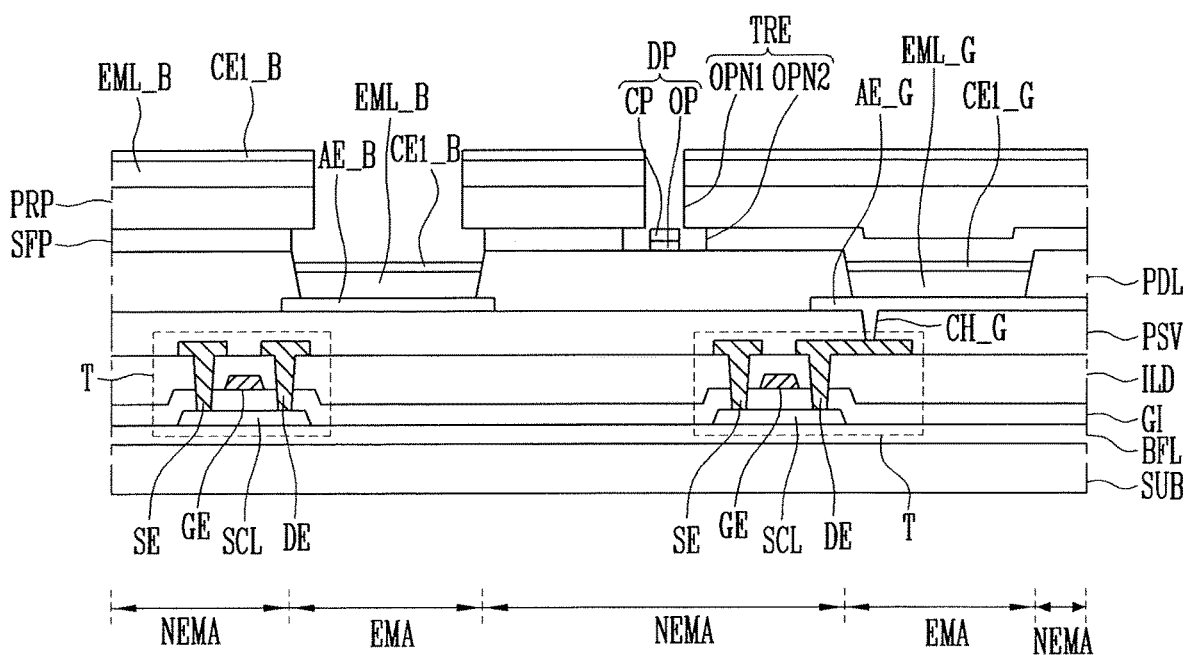
Figure 7F:
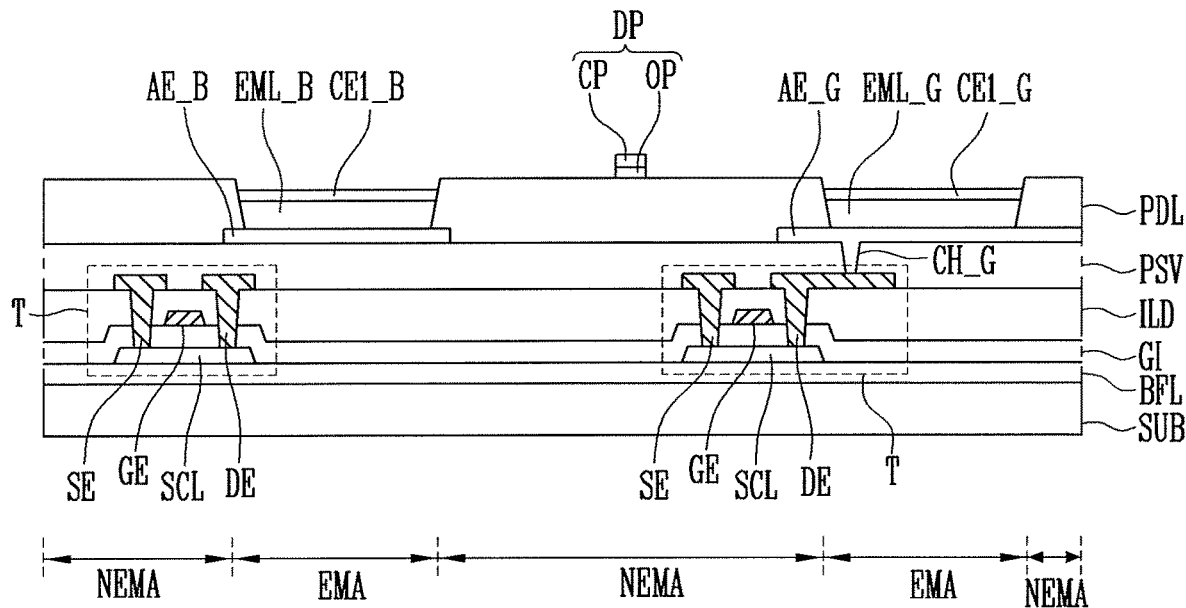

Referring to FIG. 7F, the photoresist pattern PRP and the sacrificial pattern SFP may be removed using a lift-off process. At this time, the emitting layer EML_B for the third pixel and the second electrode CE1_B of the third pixel, which are formed on the photoresist pattern PRP, may be removed together. As the photoresist pattern PRP and the sacrificial pattern SFP are removed, the trench TRE may be removed in the substrate SUB. As a result, the emission region EMA for the third pixel B on the substrate SUB may be formed to include a structure in which the first electrode AE_B for the third pixel, the emitting layer EML_B for the third pixel, and the second electrode CE1_B for the third pixel are stacked.

Figure 7G:
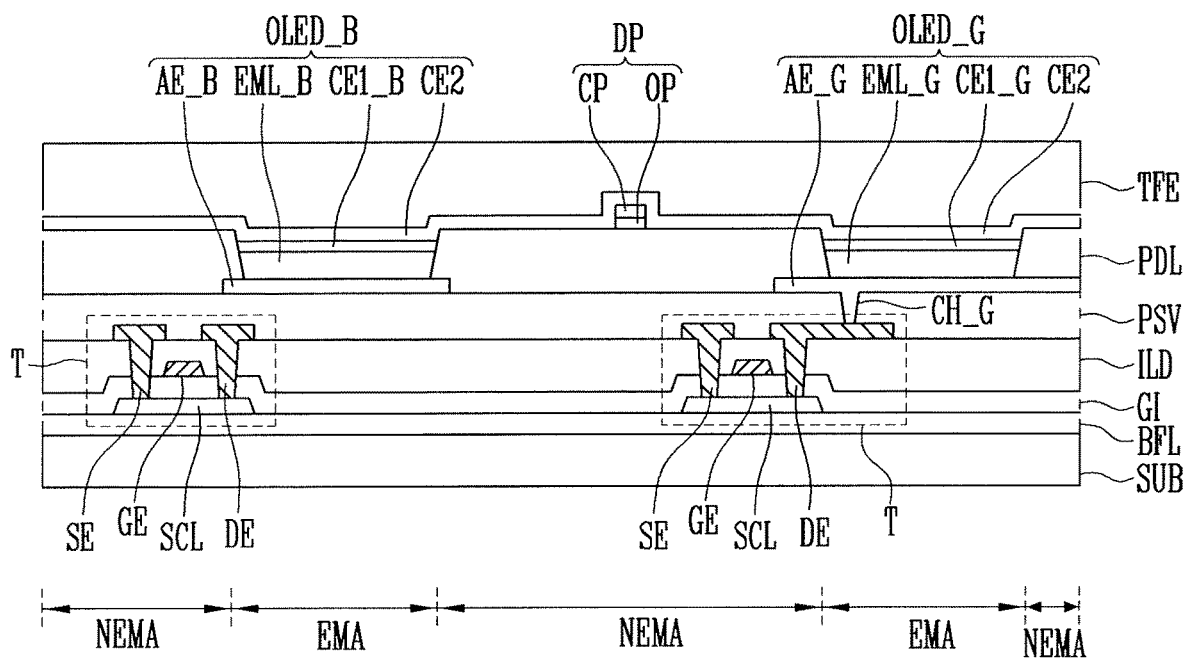

Subsequently, referring to FIG. 7G, a common electrode CE2 is formed over the second electrode CE1_B for the third pixel and the dummy pattern DP, so that a first light emitting device, a second light emitting element OLED_G, and a third light emitting element OLED_B may be finally formed on the substrate SUB. The first light emitting device may be in the first pixel R, the second light emitting element OLED_G may be in the second pixel G, and the third light emitting element OLED_B may be in the third pixel B.

Subsequently, a thin film encapsulation layer TFE is formed to cover the second light emitting element OLED_G and the third light emitting element OLED_B.

When the etchant used to remove the sacrificial layer SFL is not completely removed, but remains in the third pixel B in the manufacturing process as shown in FIGS. 7D and 9D, the sacrificial layer SFL melted in the remaining etchant is attached to the pixel defining layer PDL while moving along an end of the sacrificial pattern SFP. In this case, as shown in FIG. 8A, an icicle shape may be formed in the third pixel B.

Subsequently, when a process for forming the emitting layer EML_B for the third pixel and the second electrode CE1B for the third pixel is performed in the manufacturing process as shown in FIGS. 7E and 9B, the emitting layer EML_B for the third pixel and the second electrode CE1_B for the third pixel may be deposited on the icicle shape.

Subsequently, when the sacrificial pattern SFP and the photoresist pattern PRP are removed in the manufacturing process as shown in FIG. 7F, the emitting layer EML_B for the third pixel and the second electrode CE1_B for the third pixel, which are deposited on the icicle shape, are not removed in the third pixel B, but may remain in a fence shape. Thus, the fence shape may have a form in which the emitting layer EML_B for the third pixel and the second electrode CE1_B for the third pixel surround the icicle shape.

When the fence shape remains in the emission region EMA of the third pixel B, a defect of the third pixel B may be caused. For example, the fence shape may have influence on light emitted from the third pixel B or may have influence on the reflexibility of light incident into the third pixel B. In addition, the second electrode CE1-B for the third pixel may be disconnected in the vicinity of the icicle shape. In this case, power is not properly applied to the second electrode CE1_B for the third pixel. A flickering failure of the third pixel B may occur as a result. Additionally, the fence shape may serve as a barrier that blocks the flow of an etchant used in a process for a sacrificial layer in another pixel, except the third pixel B. In this case, the sacrificial layer is not removed but remains in the another pixel. As a result, a failure in the manufacturing process may occur.

Accordingly, in an embodiment, the trench TRE is in the non-emission region NEMA so that the etchant remaining in the third pixel B can be induced to fall in the trench TRE. The etchant remaining in the third pixel B can therefore be removed. In this case, as shown in FIG. 8B, the icicle shape may not be formed in the third pixel B.

In an embodiment, the trench TRE and the dummy pattern DP are formed in the process of manufacturing the third light emitting element OLED_B. In one embodiment, the trench TRE and the dummy pattern DP may be formed in another process, e.g., the process of manufacturing the second light emitting element OLED_G. In one embodiment, the trench TRE and the dummy pattern DP may be formed in the process of manufacturing the first light emitting element.

Figure 10A:
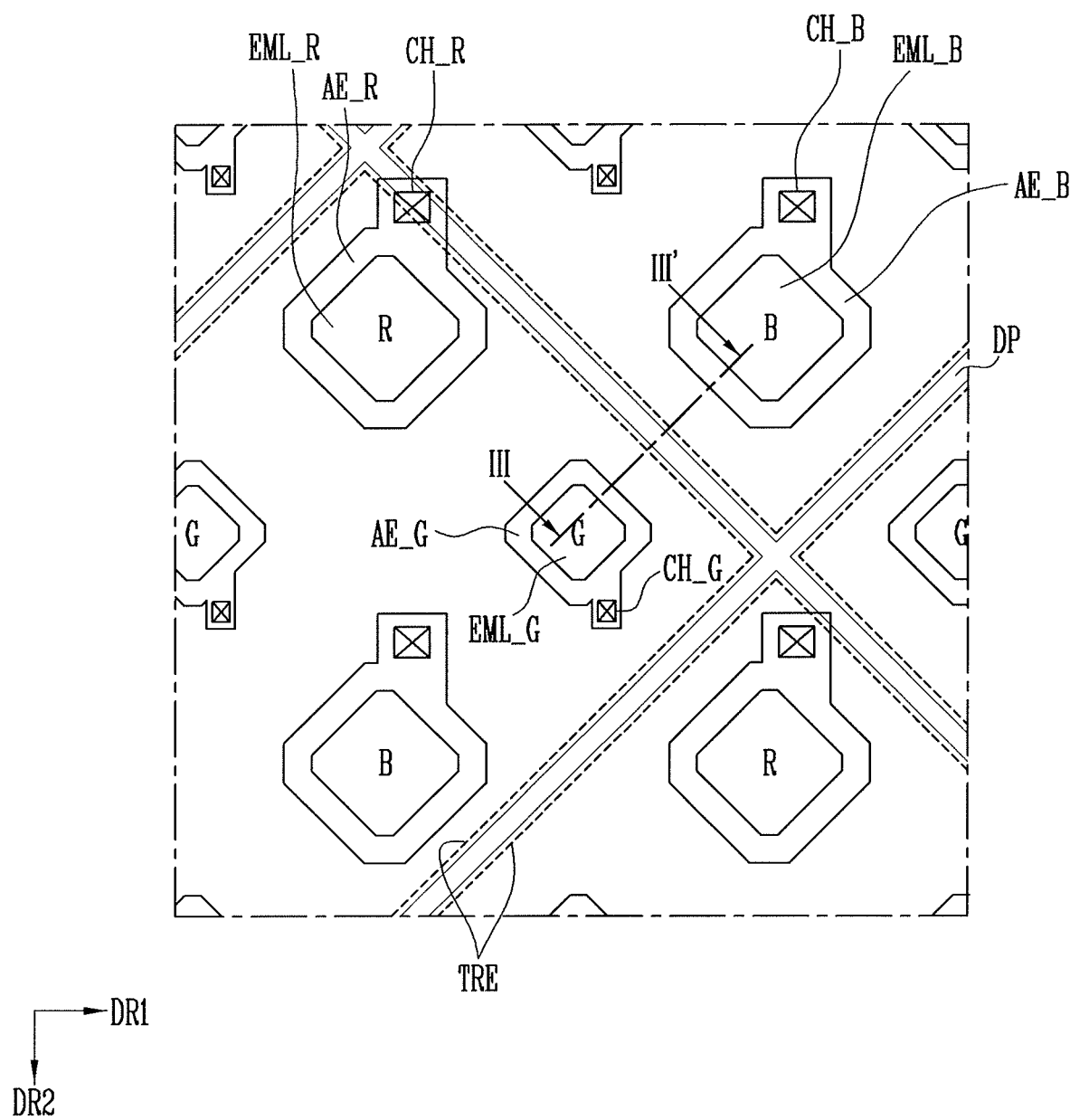
FIG. 10A illustrates an embodiment of a trench and dummy pattern which correspond to FIG. 9B.
Figure 10B:
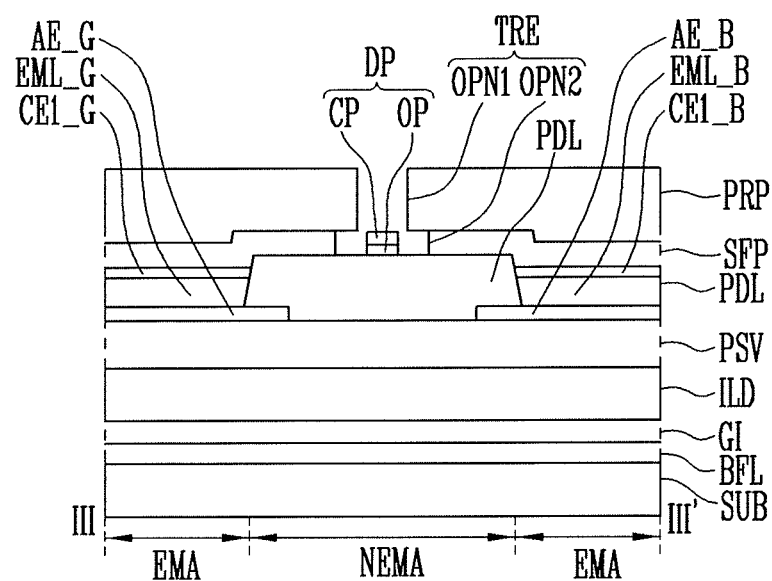
FIG. 10B illustrates a view taken section along line III-III' of FIG. 10A.

FIG. 10A illustrates another embodiment of the trench and the dummy pattern illustrated in FIG. 9B. FIG. 10B illustrates a view taken along line III-III' of FIG. 10A. In FIGS. 10A and 10B, portions different from those of the above-described embodiment will be mainly described.

Referring to FIGS. 9B, 10A, and 10B, a substrate SUB may include a first pixel R, a second pixel G, and a third pixel B. Each of the first to third pixels R, G, and B may include an emission region EMA. The substrate SUB may include a non-emission region NEMA except the emission region EMA.

In an embodiment, the first pixel R may include a first electrode AE_R for the first pixel, an emitting layer EML_R for the first pixel, and a second electrode (e.g., see CE1_R of FIG. 9) for the first pixel. The second pixel G may include a first electrode AE_G for the second pixel, an emitting layer EML_G for the second pixel, and a second electrode CE1_G for the second pixel. The third pixel B may include a first electrode AE_B for the third pixel, an emitting layer EML_B for the third pixel, and a second electrode CE1_B for the third pixel.

In an embodiment, the emitting layer EML_G for the second pixel and the emitting layer EML_B for the third pixel may be formed before the emitting layer EML_R for the first pixel is formed.

A trench TRE may be in the non-emission region NEMA of the substrate SUB. A dummy pattern DP may be in the trench TRE. The trench TRE may include a first opening OPN1 of a photoresist pattern PRP (which exposes a pixel defining layer PDL of the non-emission region NEMA to the outside) and a second opening OPN2 of a sacrificial pattern SFP, which corresponds to the first opening OPN1.

In an embodiment, the trench TRE may be in the non-emission region NEMA in a process of opening the emission region EMA of the first pixel R. The process of opening the emission region EMA of the first pixel R may be a process before the emitting layer EML_R for the first pixel and the second electrode CE1_R for the first pixel are formed.

The trench TRE may allow an echant, used to remove a sacrificial layer in a process of opening the emission region EMA of the first pixel R, not to remain in the first pixel R by inducing the etchant to be discharged to the outside of the substrate SUB.

The trench TRE may extend along the extending direction of the first pixels R, that emit the same red light in the non-emission region NEMA of the substrate SUB. For example, the trench TRE may extend along the direction in which the first pixels R adjacent to each other along a diagonal direction of a first direction DR1 extend in the non-emission region NEMA of the substrate SUB. The trench TRE may have a depth, for example, corresponding to the sum of the thickness of the sacrificial pattern SFP and the thickness of the photoresist pattern PRP.

The dummy pattern DP may be in the trench TRE and include an organic pattern OP and a conductive pattern CP on the organic pattern OP. In an embodiment, the organic pattern OP may include the same material as the emitting layer EML_R for the first pixel, and may be in the same layer as the emitting layer EML_R for the first pixel. The conductive pattern CP may include the same material as the second electrode CE1_R for the first pixel, and may be in the same layer as the second electrode CE1_R for the first pixel.

The dummy pattern DP may extend along the extending direction of the trench TRE. Therefore, the dummy pattern DP may extend along the direction in which the first pixels R adjacent to each other along the diagonal direction of the first direction DR1 extend in the non-emission region NEMA of the substrate SUB. In this case, the dummy pattern DP may be between the second pixel G and the third pixel B, which are disposed along the diagonal direction of the first direction DR1 in the non-emission region NEMA of the substrate SUB, and may emit light of different colors.

Figure 11A:
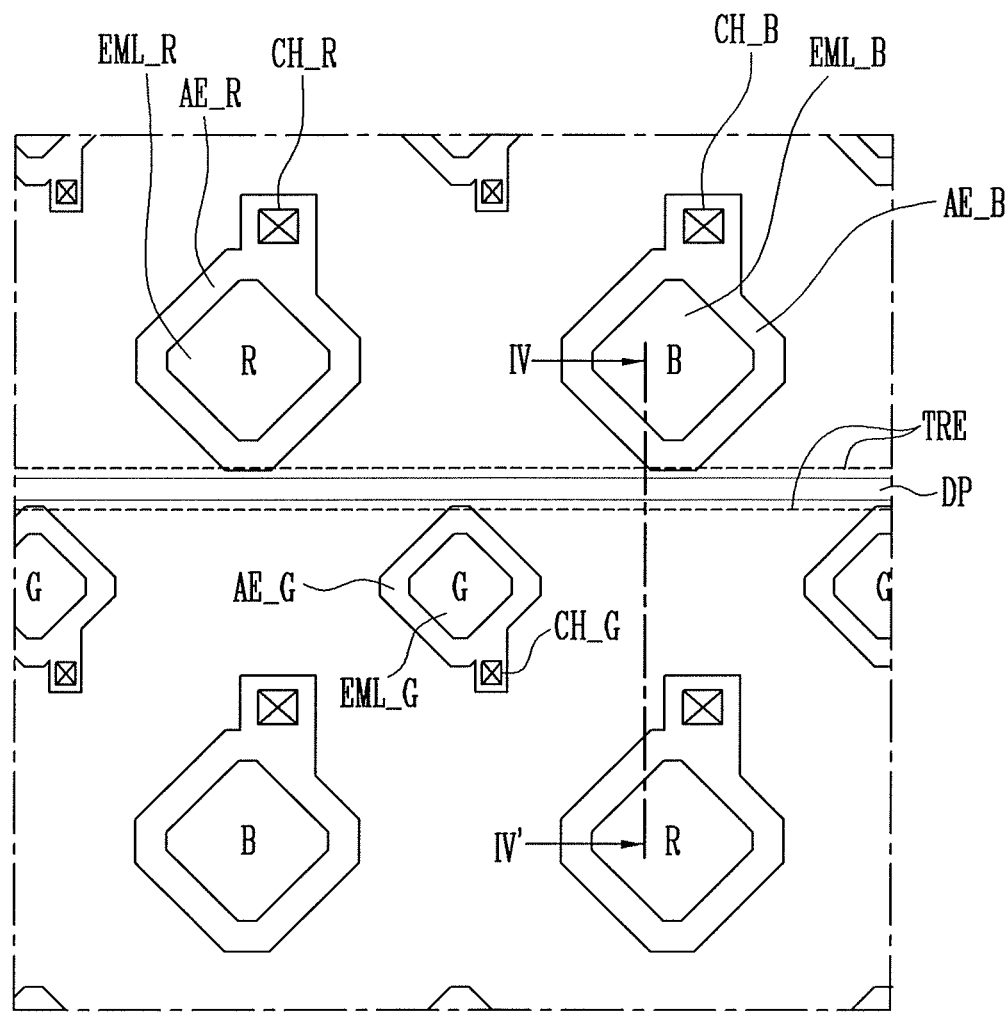
FIG. 11A illustrates another embodiment of a trench and dummy pattern which correspond to FIG. 9B.
Figure 11B:
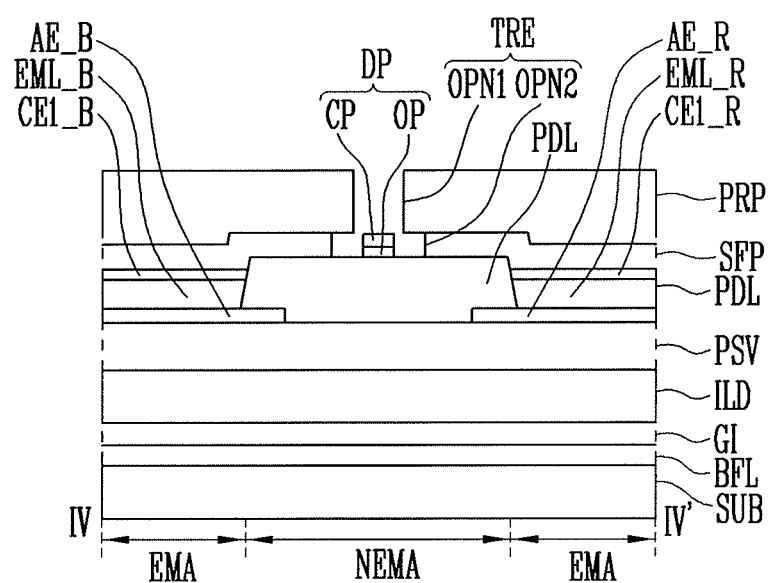
FIG. 11B illustrates a view taken along section line IV-IV' of FIG. 11A.

FIG. 11A illustrates another embodiment of the trench and the dummy pattern corresponding to FIG. 9B. FIG. 11B is a view illustrating an embodiment taken along section line IV-IV' of FIG. 11A. In FIGS. 11A and 11B, portions different from those of the above-described embodiment will be mainly described. Also, in FIGS. 11A and 11B, only light emitting elements, a trench, and a dummy pattern on a substrate having transistors provided thereon are illustrated for convenience of description.

Referring to FIGS. 9B, 11A, and 11B, a substrate SUB may include a first pixel R, a second pixel G, and a third pixel B. Each of the first to third pixels R, G, and B may include an emission region EMA. The substrate SUB may include a non-emission region NEMA except the emission region EMA.

In an embodiment, an emitting layer EML_G for the second pixel, which is in the second pixel G, may be formed after an emitting layer EML_R for the first pixel, which is in the first pixel R, and an emitting layer EML_B for the third pixel, which is in the third pixel B, are formed.

A trench TRE may be in the non-emission region NEMA of the substrate SUB. A dummy pattern DP may be in the trench TRE. The trench TRE may include a first opening OPN1 of a photoresist pattern PRP (which exposes a pixel defining layer PDL of the non-emission region NEMA to the outside) and a second opening OPN2 of a sacrificial pattern SFP, which corresponds to the first opening OPN1.

In an embodiment, the trench TRE may be in the non-emission region NEMA in a process of opening the emission region EMA of the second pixel G. The process of opening the emission region EMA of the second pixel G may be performed before the emitting layer EML_G for the second pixel and the second electrode CE1_G for the second pixel are formed.

The trench TRE may allow an echant, used to remove a sacrificial layer in a process of opening the emission region EMA of the second pixel G, not to remain in the second pixel G by inducing the etchant to be discharged to a location outside of the substrate SUB.

The trench TRE may extend along the extending direction of the second pixels G, that emit the same green light in the non-emission region NEMA of the substrate SUB. For example, the trench TRE may extend along the direction in which the second pixels G adjacent to each other along a first direction DR1 extend in the non-emission region NEMA of the substrate SUB. In addition, the trench TRE may extend along the direction in which the second pixels G, adjacent to each other along a second direction DR2 intersecting the first direction, extend in the non-emission region NEMA of the substrate SUB. The trench TRE may have a depth, for example, corresponding to the sum of the thickness of the sacrificial pattern SFP and the thickness of the photoresist pattern PRP.

The dummy pattern DP may be in the trench TRE and may include an organic pattern OP and a conductive pattern CP on the organic pattern OP. In an embodiment, the organic pattern OP may include the same material as the emitting layer EML_G for the second pixel, and may be in the same layer as the emitting layer EML_G for the second pixel. The conductive pattern CP may include the same material as the second electrode CE1_G for the second pixel and may be in the same layer as the second electrode CE1_G for the second pixel.

The dummy pattern DP may extend along the extending direction of the trench TRE. Therefore, the dummy pattern DP may extend along the direction in which the second pixels G adjacent to each other along the first direction DR1 extend in the non-emission region NEMA of the substrate SUB. In this case, the dummy pattern DP may be between the first pixel R and the third pixel B, which are alternately disposed along the second direction DR2 in the non-emission region NEMA of the substrate SUB.

Figure 12:
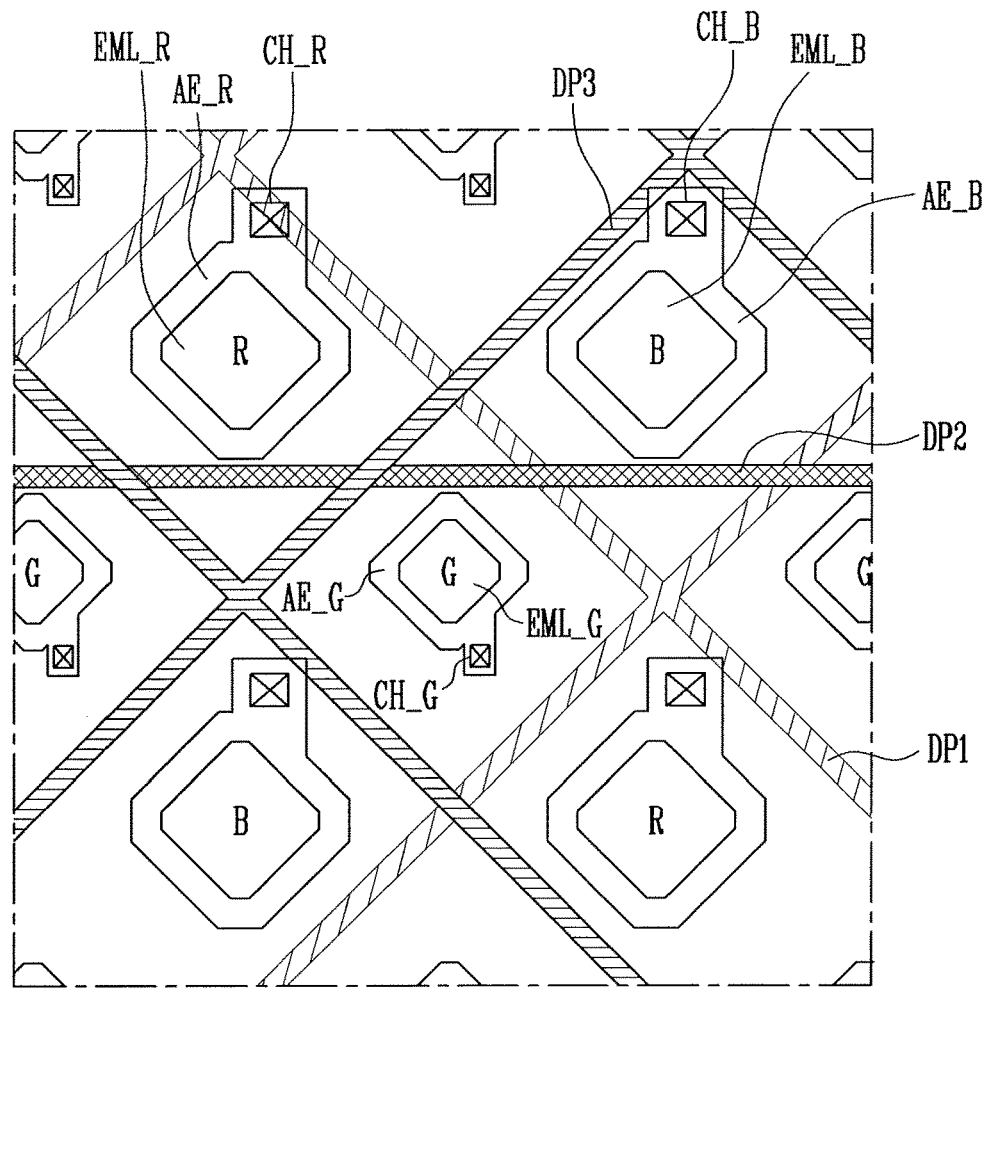
FIG. 12 illustrates another embodiment of pixels and a dummy pattern of the display device of FIG. 1.

FIG. 12 illustrates another embodiment of the arrangement relationship between the pixels and the dummy pattern in the display device of FIG. 1 Referring to FIGS. 1 and 12, a substrate SUB may include a first pixel R, a second pixel G, and a third pixel B. Each of the first to third pixels R, G, and B may include an emission region. The substrate SUB may include a non-emission region except the emission region.

The first pixel R may include a first electrode AE_R for the first pixel, an emitting layer EML_R for the first pixel, and a second electrode (e.g., see CE1_R of FIG. 9C) for the first pixel. The second pixel G may include a first electrode AE_G for the second pixel, an emitting layer EML_G for the second pixel, and a second electrode (e.g., see CE1_G of FIG. 9C) for the second pixel. The third pixel B may include a first electrode AE_B for the third pixel, an emitting layer EML_B for the third pixel, and a second electrode (e.g., see CE1_B of FIG. 11B) for the third pixel.

In an embodiment, the first pixel R may emit red light, the second pixel G may emit green light, and the third pixel B may emit blue light. The second pixel G may have an area smaller than that of the first pixel R and the third pixel B. In addition, the first pixel R and the third pixel B may have the same or different area (or size).

First to third dummy patterns DP1, DP2, and DP3 may be in the non-emission region of the substrate SUB. The first dummy pattern DP1 may be in the non-emission region of the substrate SUB along the direction in which the first pixels R that emit red light extend in a diagonal direction, crossing a first direction DR1 of the substrate SUB extend. The first dummy pattern DP1 may be formed when the emitting layer EML_R for the first pixel and the second electrode CE1_R for the first pixel are formed.

The second dummy pattern DP2 may be in the non-emission region of the substrate SUB along the direction in which the second pixels G that emit green light extend, e.g., in the first direction DR1 of the substrate SUB extend. The second dummy pattern DP2 may be formed when the emitting layer EML_G for the second pixel and the second electrode CE1_G for the second pixel are formed.

The third dummy pattern DP3 may be in the non-emission region of the substrate SUB along the direction in which the third pixels B that emit blue light extend in a diagonal direction of a second direction DR2, intersecting the first direction DR1 of the substrate SUB extend. The third dummy pattern DP3 may be formed when the emitting layer EML_B for the third pixel and the second electrode CE1_B for the third pixel are formed.

Figure 13A:
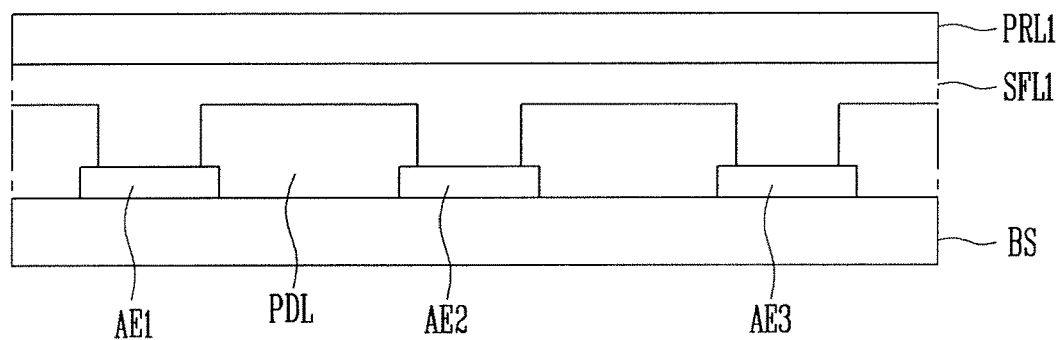
FIGS. 13A to 13P illustrate stages in a method for manufacturing first to third light emitting devices according to one embodiment.
Figure 13B:
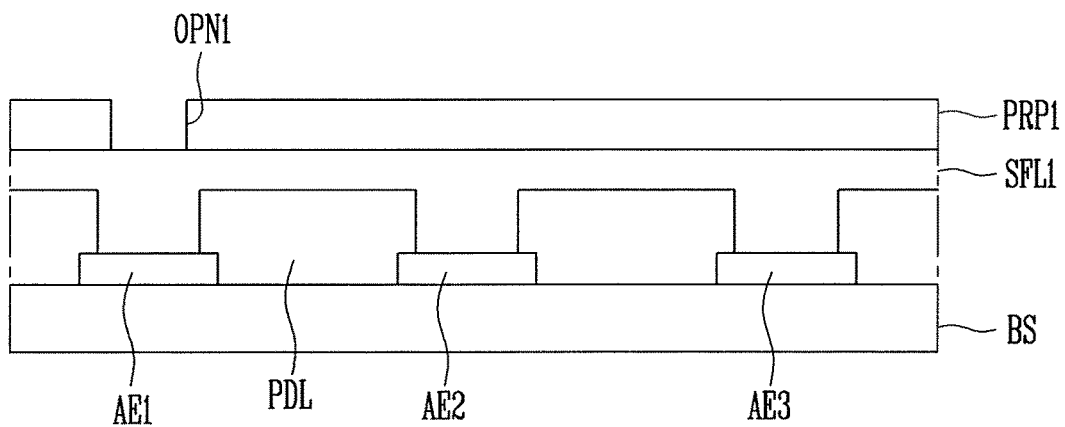
Figure 13C:
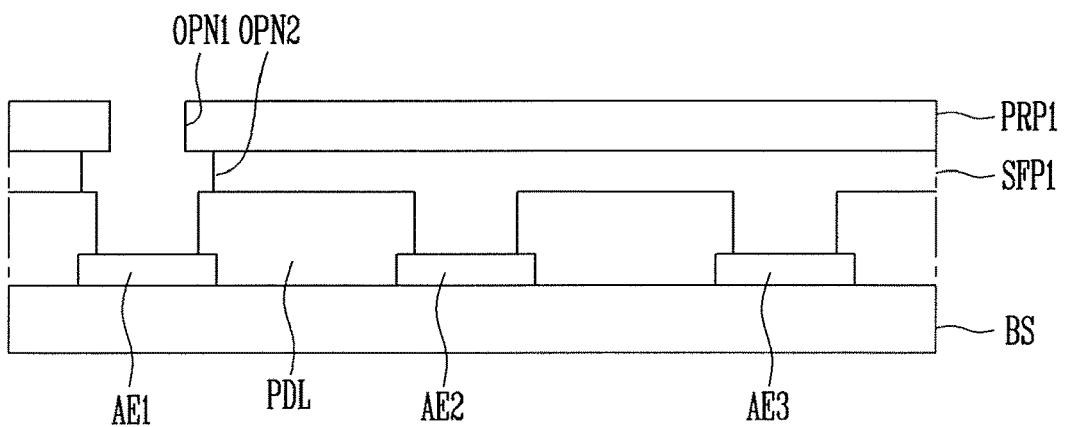
Figure 13D:
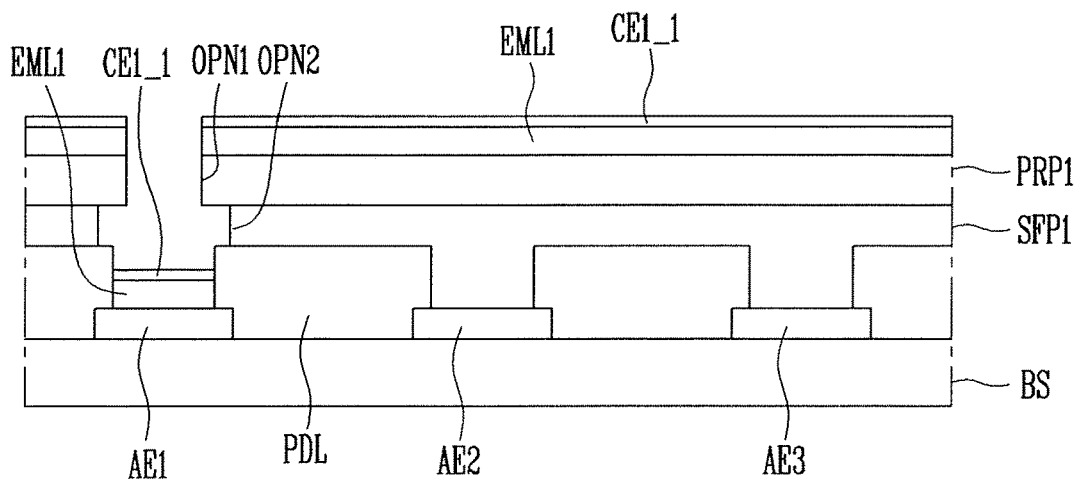
Figure 13E:
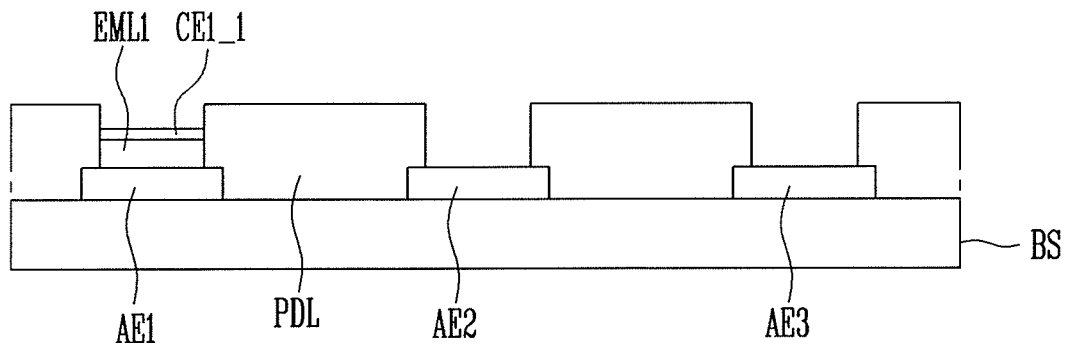
Figure 13F:
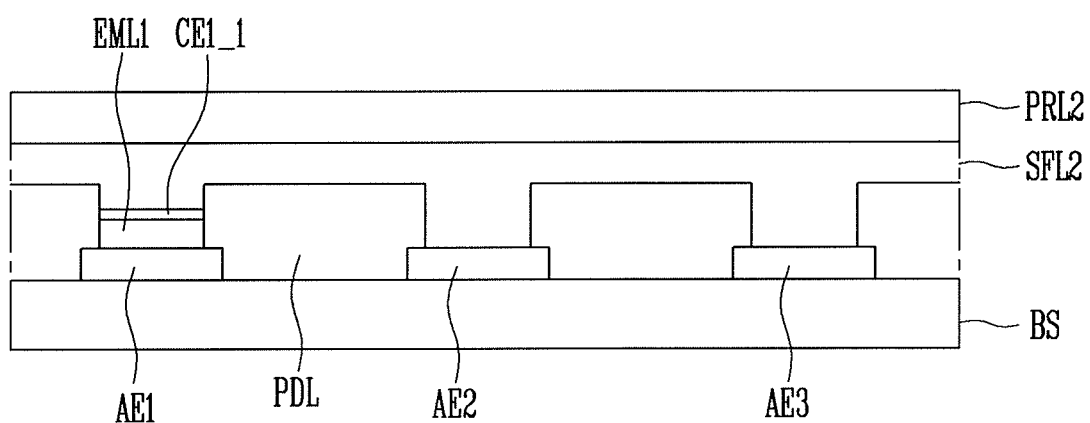
Figure 13G:
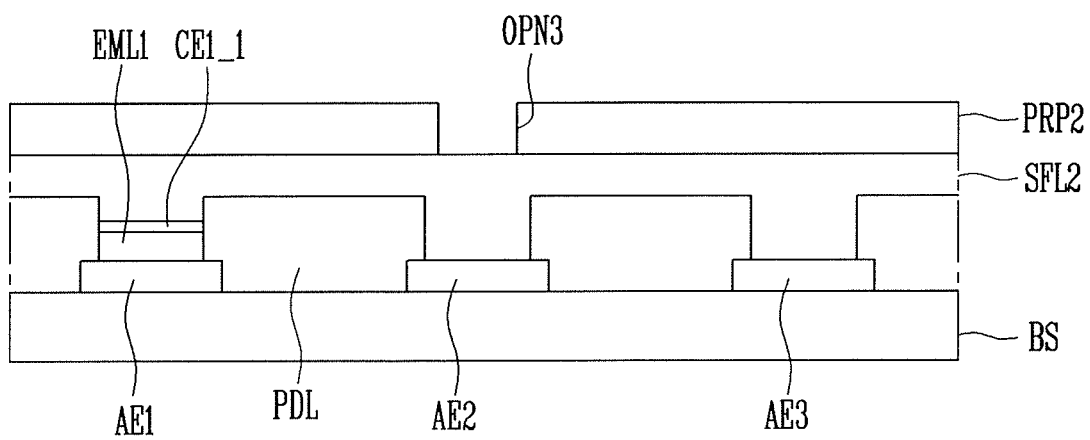
Figure 13H:
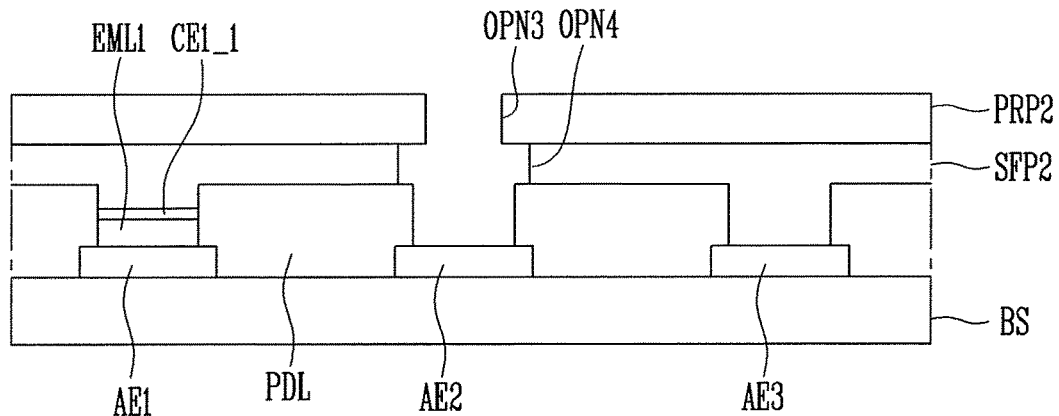
Figure 13I:
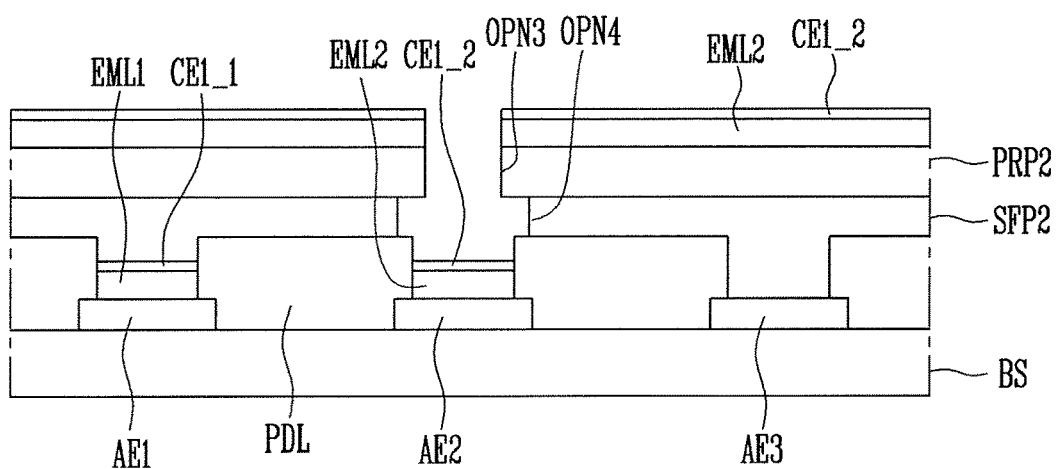
Figure 13J:
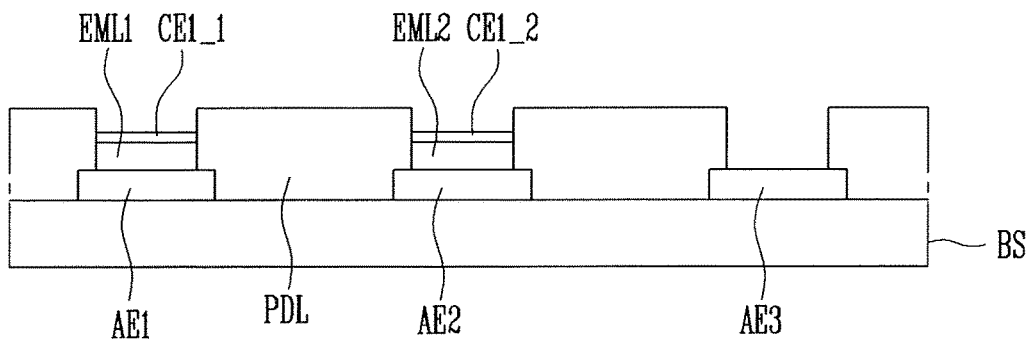
Figure 13K:
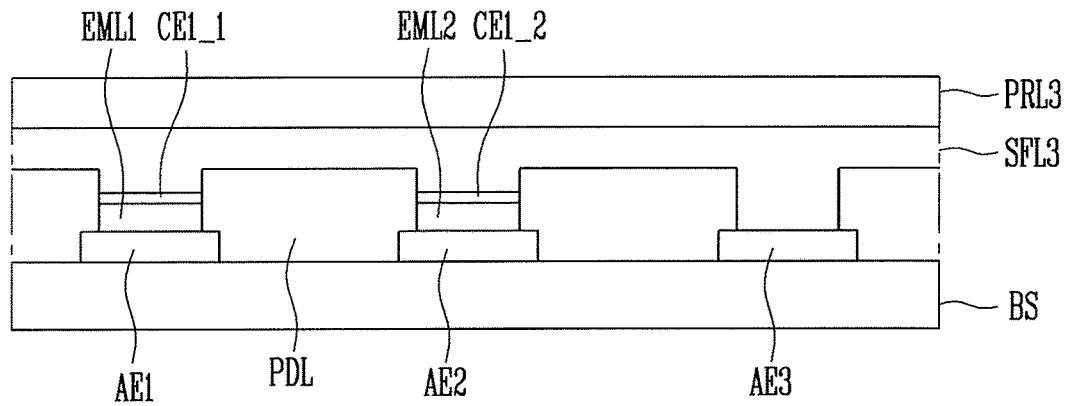
Figure 13L:
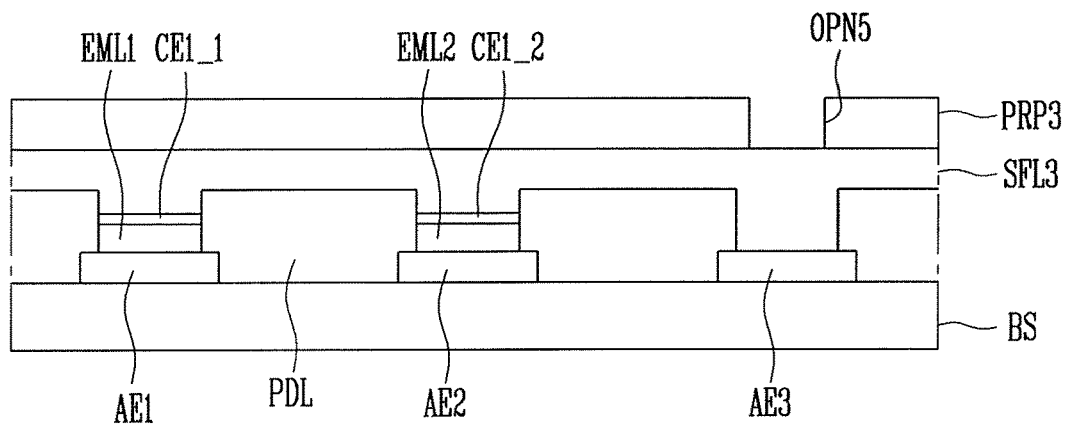
Figure 13M:
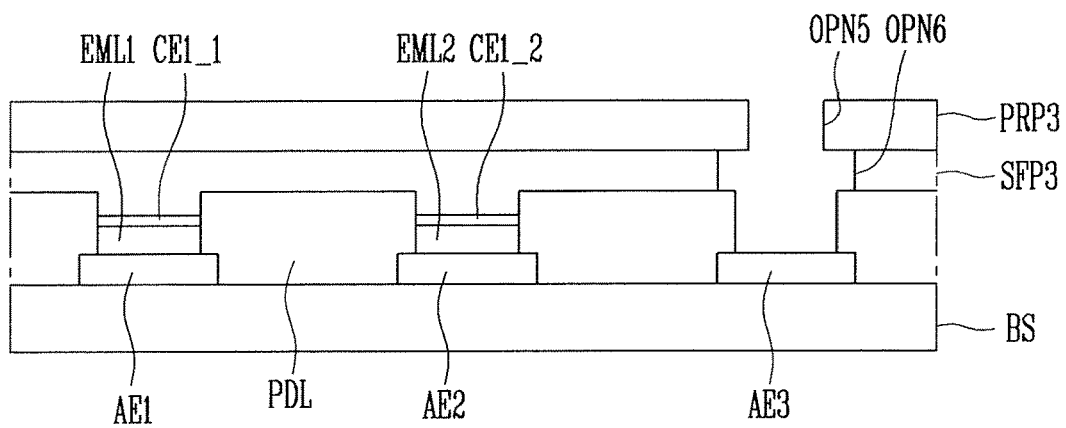
Figure 13N:
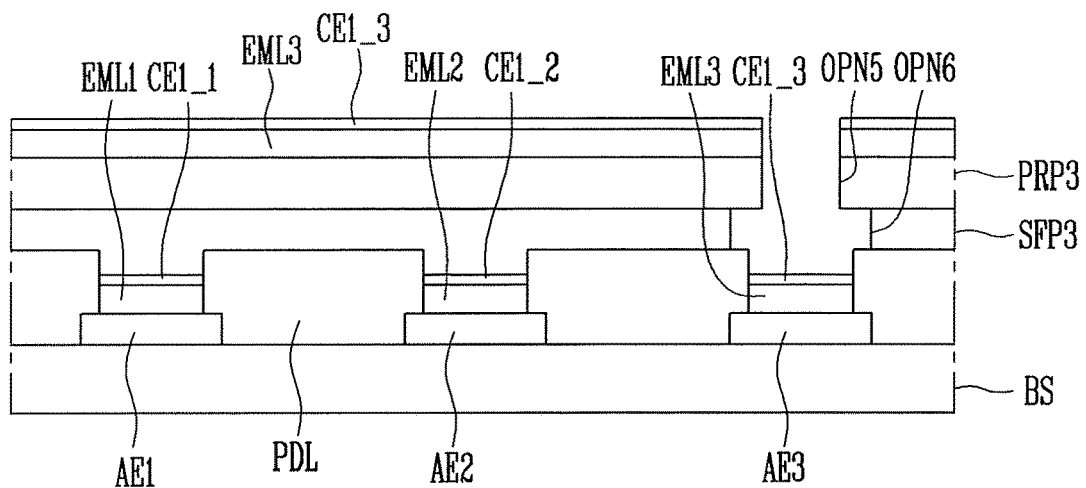
Figure 13O:
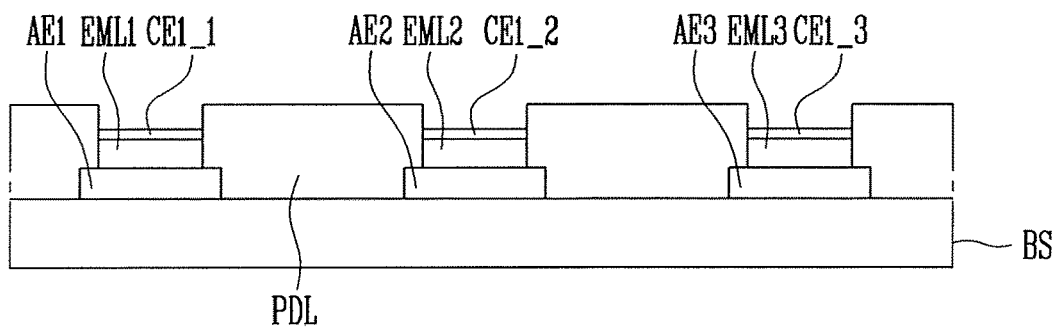
Figure 13P:
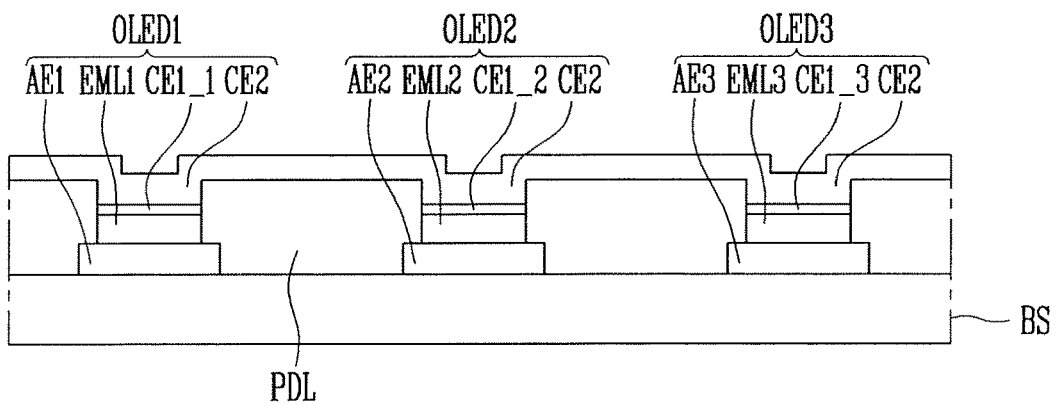

FIGS. 13A to 13P illustrate cross-sectional stages of a method for manufacturing first to third light emitting devices according to one embodiment. In FIGS. 13A to 13P, structures connected to the first to third light emitting elements, e.g., transistors, a line part, and the like are omitted for convenience of description.

Referring to FIG. 13A, (1-1)th to (1-3)th electrodes AE1, AE2, and AE3 are formed on a base substrate BS. In addition, a pixel defining layer PDL that exposes a portion of each of the (1-1)th to (1-3)th electrodes AE1, AE2, and AE3 is formed on the base substrate BS. A first sacrificial layer SFL1 and a first photoresist layer PRL1 may be disposed on the pixel defining layer PDL.

Referring to FIG. 13B, a photoresist pattern PRP1 including a first opening OPN1 that exposes a portion of the first sacrificial layer SFL1 is formed by patterning the first photoresist layer PRL1. The first opening OPN1 may expose a portion of the first sacrificial layer SFL1, which corresponds to the (1-1)th electrode AE1.

Subsequently, referring to FIG. 13C, as the first sacrificial layer SFL1 is etched using the first photoresist pattern PRP1 as a mask, a first sacrificial pattern SFP1 including a second opening OPN2 is formed. The second opening OPN2 may expose a portion of the (1-1)th electrode AE1 to the outside.

Referring to FIG. 13D, a first emitting layer EML1 is formed on the base substrate BS including the exposed (1-1)th electrode AE1. Subsequently, a (2-1)th electrode CE1_1 is formed on the first emitting layer EML1.

Referring to FIG. 13E, the first photoresist pattern PRP1 and the first sacrificial pattern SFP1 are removed through a lift-off process. At this time, the first emitting layer EML1 and the (2-1)th electrode CE1_1, which are formed on the first photoresist pattern PRP1, may be removed together. Thus, the first emitting layer EML1 and the (2-1)th electrode CE1_1 may remain on only the exposed (1-1)th electrode AE1.

Therefore, an emission region of a first pixel may be completed, which includes a structure in which the (1-1)th electrode AE1, the first emitting layer EML1, and the (2-1)th electrode CE1_1 are sequentially stacked on the base substrate BS.

Referring to FIG. 13F, a second sacrificial layer SFL2 and a second photoresist layer PRL2 may be formed on the base substrate BS including the emission region of the first pixel.

Referring to FIG. 13G, a second photoresist pattern PRP2 including a third opening OPN3 that exposes a portion of the second sacrificial layer SFL2 is formed by patterning the second photoresist layer PRL2. The third opening OPN3 may expose a portion of the second sacrificial layer SFL2, which corresponds to the (1-2)th electrode AE2.

Referring to FIG. 13H, as the second sacrificial layer SFL2 is etched using the second photoresist pattern PRP2 as a mask, a second sacrificial pattern SFP2 including a fourth opening OPN4 is formed. The fourth opening OPN4 may expose a portion of the (1-2)th electrode AE2 to the outside.

Referring to FIG. 13I, a second emitting layer EML2 is formed on the base substrate BS including the exposed (1-2)th electrode AE2. Subsequently, a (2-2)th electrode CE1_2 is formed on the second emitting layer EML2.

Referring to FIG. 13J, the second photoresist pattern PRP2 and the second sacrificial pattern SFP2 are removed through a lift-off process. At this time, the second emitting layer EML2 and the (2-2)th electrode CE1_2, which are formed on the second photoresist pattern PRP2, may be removed together. Thus, the second emitting layer EML2 and the (2-2)th electrode CE1_2 may remain on only the exposed (1-2)th electrode AE2.

Therefore, an emission region of a second pixel may be completed, which includes a structure in which the (1-2)th electrode AE2, the second emitting layer EML2, and the (2-2)th electrode CE1_2 are sequentially stacked on the base substrate BS.

Referring to FIG. 13K, a third sacrificial layer SFL3 and a third photoresist layer PRL3 may be formed on the base substrate BS including the emission region of the second pixel.

Referring to FIG. 13L, a third photoresist pattern PRP3 including a fifth opening OPN5 that exposes a portion of the third sacrificial layer SFL3 is formed by patterning the third photoresist layer PRL3. The fifth opening OPN5 may expose a portion of the third sacrificial layer SFL3, which corresponds to the (1-3)th electrode AE3.

Referring to FIG. 13M, as the third sacrificial layer SFL3 is etched using the third photoresist pattern PRP3 as a mask, a third sacrificial pattern SFP3 including a sixth opening OPN6 is formed. The sixth opening OPN6 may expose a portion of the (1-3)th electrode AE3 to the outside.

Referring to FIG. 13N, a third emitting layer EML3 is formed on the base substrate BS including the exposed (1-3)th electrode AE3. Subsequently, a (2-3)th electrode CE1_3 is formed on the third emitting layer EML3.

Referring to FIG. 13O, the third photoresist pattern PRP3 and the third sacrificial pattern SFP3 are removed through a lift-off process. At this time, the third emitting layer EML3 and the (2-3)th electrode CE1_3, which are formed on the third photoresist pattern PRP3, may be removed together. Thus, the third emitting layer EML3 and the (2-3)th electrode CE1_3 may remain on only the exposed (1-3)th electrode AE3.

Therefore, an emission region of a third pixel may be completed, which includes a structure in which the (1-3)th electrode AE3, the third emitting layer EML3, and the (2-3)th electrode CE1_3 are sequentially stacked on the base substrate BS.

Referring to FIG. 13P, a common electrode CE2 is disposed on the base substrate BS including the emission region of the first pixel, the emission region of the second pixel, and the emission region of the third pixel. Therefore, a first light emitting element OLED1 may be finally provided in the emission region of the first pixel, a second light emitting element OLED2 may be finally provided in the emission region of the second pixel, and a third light emitting element OLED3 may be finally provided in the emission region of the third pixel.

The first emitting element OLED1 may include the (1-1)th electrode AE1, the first emitting layer EML1, the (2-1)th electrode CE1_1, and the common electrode CE2. The second emitting element OLED2 may include the (1-2)th electrode AE2, the second emitting layer EML2, the (2-2)th electrode CE1_2, and the common electrode CE2. The third light emitting element OLED3 may include the (1-3)th electrode AE3, the third emitting layer EML3, the (2-3)th electrode CE1_3, and the common electrode CE2.

Figure 14:
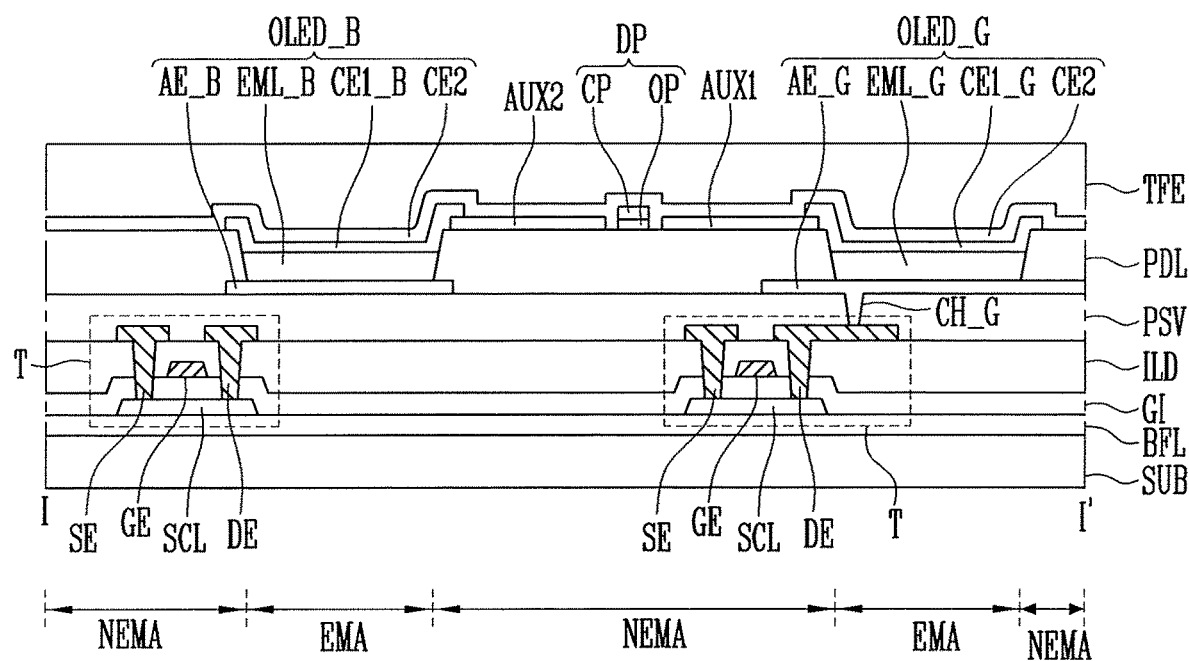
FIG. 14 illustrates another embodiment of a display device which corresponds to the view taken along section line I-I' of FIG. 5.

FIG. 14 illustrates another embodiment of the display device of FIG. 6, which corresponds to a view taken along section line I-I' of FIG. 5. The display device of FIG. 14 may have a configuration similar to that of the display device of FIG. 6, except auxiliary electrodes AUX1 and AUX2.

Referring to FIGS. 5, 6, and 14, the display device may include a substrate SUB on which first to third pixels R, G, and B are arranged. The first pixel R may include an emission region EMA including a structure in which a first electrode AE_R for the first pixel, an emitting layer EML_R for the first pixel, and a second electrode for the first pixel are stacked. The second pixel G may include an emission region including a structure in which a first electrode AE_G for the second pixel, an emitting layer EML_G for the second pixel, and a second electrode CE1_G for the second pixel are stacked. The third pixel B may include an emission region EMA including a structure in which a first electrode AE_B for the third pixel, an emitting layer EML_B for the third pixel, and a second electrode CE1_B for the third pixel are stacked.

A common electrode CE2 may be over the second electrode for the first pixel, the second electrode CE1_G for the second pixel, and the second electrode CE1_B for the third pixel.

Therefore, the first pixel R may include a first light emitting element configured with the first electrode AE_R for the first pixel, the emitting layer EML_R for the first pixel, the second electrode for the first pixel, and the common electrode CE2. The second pixel G may include a second light emitting element OLED_G configured with the first electrode AE_G for the second pixel, the emitting layer EML_G for the second pixel, the second electrode CE1_G for the second pixel and the common electrode CE2. The third pixel B may include a third light emitting element OLED_B configured with the first electrode AE_B for the third pixel, the emitting layer EML_B for the third pixel, the second electrode CE1_B for the third pixel, and the common electrode CE2.

The substrate SUB may include a non-emission region NEMA except the emission region EMA of the first pixel R, the emission region EMA of the second pixel G, and the emission region EMA of the third pixel B.

Auxiliary electrodes AUX1 and AUX2 and a dummy pattern DP may be in the non-emission region NEMA. The auxiliary electrodes AUX1 and AUX2 may include a first auxiliary electrode AUX1, in the non-emission region NEMA adjacent to the emission region EMA of the second pixel G, and a second auxiliary electrode AUX2 in the non-emission region NEMA adjacent to the emission region EMA of the third pixel B. An auxiliary electrode may be in the non-emission region NEMA adjacent to the emission region EMA of the first pixel R.

The first auxiliary electrode AUX1 may be electrically connected to the second electrode CE1_G for the second pixel and the common electrode CE2. The second auxiliary electrode AUX2 may be electrically connected to the second electrode CE1_B for the third pixel and the common electrode CE2.

In an embodiment, the dummy pattern DP may be between the first auxiliary electrode AUX1 and the second auxiliary electrode AUX2 in the non-emission region NEMA of the substrate SUB. The dummy pattern DP may extend in the extending direction of the third pixels B, adjacent to each other along a diagonal direction of a second direction DR2 of the substrate in the non-emission region NEMA of the substrate SUB.

The dummy pattern DP may include an organic pattern OP on a pixel defining layer PDL and a conductive pattern CP on the organic pattern OP. The organic pattern OP may include the same material as the emitting layer EML_B for the third pixel, and may be in the same layer as the emitting layer EML_B for the third pixel. The conductive pattern CP may include the same material as the second electrode CE1_B for the third pixel, and may be in the same layer as the second electrode CE1_B for the third pixel.

The display device according to the aforementioned embodiments may be employed in various electronic devices, e.g., televisions, notebook computers, cellular phones, smart phones, smart pads, PMPs, PDAs, navigations, various wearable devices such as smart watches, and the like.

By way of summation and review, during manufacture, the organic emitting layer of each organic light emitting element may be selectively formed through a mask process. The mask process may include a process of etching a sacrificial layer using a photoresist pattern as a mask. The sacrificial layer may be partially etched using an etchant generated by melting the sacrificial layer. However, the etchant may not be completely removed, e.g., may remain in each pixel. This may cause a failure or other defect.

In accordance with one or more of the aforementioned embodiments, a display device and a manufacturing method are provided which may reduce or minimize the occurrence of a failure. For example, a dummy pattern may be provided in the non-emission region, e.g., on a pixel defining layer between adjacent pixels, and may extend along an extending direction of one pixel.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
    a substrate including a display region and a non-display region, the display region including a plurality of first pixels of a first type, a plurality of second pixels of a second type, and a plurality of third pixels of a third type, each of the first to third pixels having:
        an emission region from which light is to be emitted;
        a light emitting element in the emission region;
        one or more pixel electrodes; and
        a pixel circuit area to drive the light emitting element;
    a dummy pattern extending through a non-emission region of the substrate located in the display region between adjacent pixels among any two or more of the first pixels, the second pixels and the third pixels, and disposed directly on a pixel defining layer that includes openings exposing a portion of the respective pixel electrodes of the adjacent pixels; and
    a thin film encapsulation layer covering the dummy pattern and each of the emission regions.

2. The display device of claim 1, wherein the light emitting element in each of the first to third pixels includes:
    a first electrode electrically connected to the pixel circuit area as the one or more pixel electrodes;
    an emitting layer on the first electrode with the pixel defining layer exposing a portion of the first electrode; and
    a second electrode on the emitting layer.

3. The display device of claim 2, wherein the dummy pattern includes:
    an organic pattern on the pixel defining layer to correspond to the non-emission region; and
    a conductive pattern on the organic pattern.

4. The display device of claim 3, wherein:
    the organic pattern includes a same material as the emitting layer, and
    the conductive pattern includes a same material as the second electrode.

5. The display device of claim 2, wherein:
    the light emitting element includes a common electrode over the second electrode, and
    the common electrode is commonly provided throughout the first to third pixels.

6. The display device of claim 5, further comprising:
    an auxiliary electrode disposed on the pixel defining layer to correspond to the non-emission region, the auxiliary electrode being disposed so as to be spaced apart from the dummy pattern,
    wherein the auxiliary electrode electrically connects the second electrode and the common electrode.

7. The display device of claim 1, wherein each of the plurality of first pixels, each of the plurality of second pixels, and each of the plurality of third pixels are to emit light of different colors.

8. The display device of claim 7, wherein:
    each first pixel is to emit red light;
    each second pixel is to emit green light;
    each third pixel is to emit blue light; and
    each second pixel is smaller than each first pixel and each third pixel.

9. The display device of claim 8, wherein the second pixels are consecutively arranged along a first direction of the substrate and are repeatedly disposed for every two rows in a second direction intersecting the first direction.

10. The display device of claim 9, wherein:
    two first pixels that are to emit red light, with one second pixel therebetween, extend along a diagonal direction of the first direction; and
    two third pixels that are to emit blue light, with the one second pixel therebetween, extend along a diagonal direction of the second direction.

11. The display device of claim 10, wherein one first pixel and one third pixel are alternately disposed along the second direction to form one pixel column.

12. The display device of claim 11, wherein the dummy pattern extends along the diagonal direction of the second direction in which the two third pixels extend in the non-emission region.

13. The display device of claim 1, wherein:
    the pixel circuit area includes at least one transistor on the substrate,
    the at least one transistor is electrically connected to a first electrode, and
    the at least one transistor includes:
        a semiconductor layer on the substrate;
        a gate electrode on the semiconductor layer with a gate insulating layer therebetween; and
        a source electrode and a drain electrode, each of the source electrode and the drain electrode being connected to the semiconductor layer.

14. A display device, comprising:
    a substrate including a display region and a non-display region, the display region including a plurality of first pixels of a first type, a plurality of second pixels of a second type, and a plurality of third pixels of a third type, each of the first to third pixels having:
        an emission region from which light is to be emitted;
        a light emitting element in the emission region that includes a first electrode, an emitting layer on the first electrode, and a second electrode on the emitting layer;
        one or more pixel electrodes; and
        a pixel circuit area to drive the light emitting element;
    a dummy pattern extending through a non-emission region of the substrate located in the display region between adjacent pixels among any two or more of the first pixels, the second pixels, and the third pixels, and disposed on the second electrode and directly on a pixel defining layer that includes openings exposing a portion of the respective pixel electrodes of the adjacent pixels; and a thin film encapsulation layer covering the dummy pattern and each of the emission regions.

15. The display device of claim 14, wherein the dummy pattern includes:

an organic pattern on the pixel defining layer to correspond to the non-emission region; and a conductive pattern on the organic pattern.

16. The display device of claim 15, wherein:

the organic pattern includes a same material as the emitting layer, and the conductive pattern includes a same material as the second electrode.

17. The display device of claim 16, wherein:

each first pixel is to emit red light;

each second pixel is to emit green light;

each third pixel is to emit blue light; and each second pixel is smaller than each first pixel and each third pixel.

* * * * *